US012776696B2

(12) United States Patent
Jung et al.

(10) Patent No.: US 12,776,696 B2
(45) Date of Patent: Oct. 27, 2026

(54) POWER CONVERSION DEVICE HAVING MULTI-LEVEL STRUCTURE

(71) Applicant: LG INNOTEK CO., LTD., Seoul (KR)

(72) Inventors: Kwang Soon Jung, Seoul (KR); Jeong Heum Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 377 days.

(21) Appl. No.: 18/284,001

(22) PCT Filed: Mar. 28, 2022

(86) PCT No.: PCT/KR2022/004361
§ 371 (c)(1),
(2) Date: Sep. 25, 2023

(87) PCT Pub. No.: WO2022/203484
PCT Pub. Date: Sep. 29, 2022

(65) Prior Publication Data

US 2024/0171059 A1 May 23, 2024

(30) Foreign Application Priority Data

Mar. 26, 2021 (KR) ........................ 10-2021-0039928

(51) Int. Cl.
*G05F 1/67* (2006.01)
*G01R 19/00* (2006.01)
(Continued)

(52) U.S. Cl.
CPC ........ *H02M 1/007* (2021.05); *G01R 19/0084* (2013.01); *H02J 3/38* (2013.01);
(Continued)

(58) Field of Classification Search
CPC ............ G05F 1/67; H02J 2300/26; H02J 3/26
See application file for complete search history.

(56) References Cited

U.S. PATENT DOCUMENTS

| | | | | |
|---|---|---|---|---|
| 9,024,478 B2 * | 5/2015 | Cooley | H03K 3/57 307/82 |
| 9,368,964 B2 * | 6/2016 | Adest | H02J 7/00 |

(Continued)

FOREIGN PATENT DOCUMENTS

| | | |
|---|---|---|
| CN | 101953060 | 1/2011 |
| CN | 103378756 | 10/2013 |

(Continued)

OTHER PUBLICATIONS

International Search Report dated Jul. 13, 2022 issued in Application No. PCT/KR2022/004361.

(Continued)

*Primary Examiner* — Gary A Nash
(74) *Attorney, Agent, or Firm* — KED & ASSOCIATES, LLP

(57) ABSTRACT

A power conversion device according to one embodiment of the present invention comprises: converters that are connected to respective cell strings; a voltage detection unit for detecting an input voltage and/or an output voltage of each of the plurality of converters; and a control unit which generates a control signal for each of the plurality of converters by using the voltage detected by the voltage detection unit and applies same, wherein the plurality of converters have a multi-level structure.

19 Claims, 22 Drawing Sheets

(51) Int. Cl.

| | |
|---|---|
| ***H02J 3/26*** | (2026.01) |
| ***H02J 3/38*** | (2006.01) |
| ***H02M 1/00*** | (2006.01) |
| ***H02M 3/158*** | (2006.01) |
| ***H02S 40/30*** | (2014.01) |
| *H02J 101/24* | (2026.01) |

(52) U.S. Cl.

CPC ....... *H02M 1/0077* (2021.05); *H02M 3/1582* (2013.01); *H02S 40/30* (2014.12); *G05F 1/67* (2013.01); *H02J 3/26* (2013.01); *H02J 2101/25* (2026.01)

(56) References Cited

U.S. PATENT DOCUMENTS

| | | | | |
|---|---|---|---|---|
| 10,476,403 | B2 * | 11/2019 | Deboy | H02J 3/40 |
| 2009/0206666 | A1 * | 8/2009 | Sella | H02J 3/388 307/43 |
| 2011/0012429 | A1 | 1/2011 | Fornage | |
| 2013/0187473 | A1 * | 7/2013 | Deboy | H02M 7/49 307/82 |
| 2014/0161201 | A1 | 6/2014 | Yukizane et al. | |
| 2015/0008748 | A1 * | 1/2015 | Deboy | H02M 7/53871 307/77 |
| 2015/0340947 | A1 * | 11/2015 | Deboy | H02M 3/1582 307/82 |
| 2018/0301905 | A1 | 10/2018 | Dai et al. | |

FOREIGN PATENT DOCUMENTS

| | | |
|---|---|---|
| CN | 103703647 | 4/2014 |
| CN | 203775134 | 8/2014 |
| CN | 104124699 | 10/2014 |
| CN | 106786944 | 5/2017 |
| CN | 109672166 | 4/2019 |
| JP | 2004-215439 | 7/2004 |
| JP | 2008-245458 | 10/2008 |
| JP | 2013-097531 | 5/2013 |
| JP | 2013-198385 | 9/2013 |
| JP | 2014-199477 | 10/2014 |
| JP | 2019-201543 | 11/2019 |
| KR | 10-2012-0096115 | 8/2012 |
| KR | 10-2015-0032052 | 3/2015 |
| KR | 10-2015-0118477 | 10/2015 |
| KR | 10-1779055 | 9/2017 |
| KR | 10-2020-0048724 | 5/2020 |
| WO | WO 2013/014879 | 1/2013 |
| WO | WO 2017/056922 | 4/2017 |
| WO | WO 2018/087813 | 5/2018 |

OTHER PUBLICATIONS

European Search Report issued in Application No. 22776184.8 dated Feb. 14, 2025.

Korean Office Action issues in Application No. 10-2021-0039928 dated Apr. 28, 2025.

Korean Office Action dated Jan. 27, 2026 issued in Application No. 10-2021-0039928.

Japanese Office Action dated Mar. 31, 2026 issued in Application No. 2023-559044.

Chinese Office Action dated Jul. 17, 2026 issued in Application No. 202280031298.5.

* cited by examiner

FIG. 14

| Parameter | Equation |
|---|---|
| Cell string voltage1 | $V_{F1}$~$V_{F2}$ |
| Cell string voltage2 | $V_{F2}$~$V_{F3}$ |
| Cell string voltage3 | $V_{F3}$ |
| Output voltage1 | $V_{B1}$~$V_{B2}$ |
| Output voltage2 | $V_{B2}$~$V_{B3}$ |
| Output voltage3 | $V_{B3}$ |
| Total Output voltage | $V_{B1}$ |

| VOLTAGE RELATIONSHIP | NECESSARY FUNCTION | APPLICABLE CIRCUIT |
|---|---|---|
| LOWEST CELL STRING > $V_{aux}$ | STEP-DOWN | LENEAR REGULATOR, BUCK CONVERTER |
| $V_{aux}$ > HIGHEST CELL STRING VOLTAGE | STEP-UP | CHARGE PUMP, BOOST CONVERTER |
| HIGHEST CELL STRING > $V_{aux}$ > LOWEST CELL STRING | STEP-UP AND STEP-DOWN | BUCK-BOOST CONVERTER |

| ORDER | CIRCUIT COMBINATION | |
|---|---|---|
| | STEP-DOWN REGULATOR | STEP-UP REGULATOR |
| 1 | LINEAR REGULATOR | CHARGE PUMP |
| 2 | LINEAR REGULATOR | BOOST CONVERTER |
| 3 | BUCK CONVERTER | CHARGE PUMP |
| 4 | BUCK CONVERTER | BOOST CONVERTER |

POWER CONVERSION DEVICE HAVING MULTI-LEVEL STRUCTURE

CROSS-REFERENCE TO RELATED PATENT APPLICATIONS

This application is a U.S. National Stage Application under 35 U.S.C. § 371 of PCT Application No. PCT/KR2022/004361, filed Mar. 28, 2022, which claims priority to Korean Patent Application No. 10-2021-0039928, filed Mar. 26, 2021, whose entire disclosures are hereby incorporated by reference.

TECHNICAL FIELD

The present invention relates to a power conversion device, and more particularly, to a power conversion device using a plurality of converters having a multi-level structure and a solar module.

BACKGROUND ART

Solar power generation is an eco-friendly energy generation method that replaces existing chemical power generation or nuclear power generation and is widely distributed. Solar power generation has a stand-alone type in which a battery is connected to the converter and a link type being connected with the power system, and in general, stand-alone power generation consists of solar cells, storage batteries, power conversion devices, and the like, and power grid-connected systems are configured to interact with load grid lines and power by connecting to commercial power sources.

Solar cell modules have different maximum power points depending on the amount of sunlight, temperature, and the like. Module-level power electronics (mlpe) with maximum power point tracking (mppt) control on a module basis can be used to operate the solar cell at its maximum power point. However, the mlpe with a single converter is difficult to follow the optimized maximum power point when the amount of sunlight and temperature of each cell inside the module is different.

As shown in FIG. 1, in a method with a single converter, all cells are connected in series and inputted to the mlpe, and the mlpe performs maximum power point tracking control for the entire solar cell module. In this case, when the maximum power point is different for each cell string due to the difference in the amount of sunlight in the cell string, there is a problem in that the maximum power point tracking control for the individual string is impossible.

In addition, as shown in FIG. 2, in the mlpe of a method with a single converter, the solar cell module, dc/dc converter, and controller are designed with the same reference potential (electric potential). For this reason, when the controller detects the solar cell module voltage and the dc/dc converter output voltage, the voltage detection circuit can be implemented only with the resistor divider circuit. However, in mlpe of multi-level structure, the above method cannot be applied as it is.

In addition, mlpe with a single converter application method uses the same ground for the solar cell module, dc/dc converter, controller, and auxiliary power. Due to this, as shown in FIGS. 3 and 4, it is possible to configure an auxiliary power circuit for receiving power from the solar cell module and supplying auxiliary power to a converter, a controller, and the like. However, in mlpe of multi-level structure, the above method cannot be applied as it is.

DETAILED DESCRIPTION OF THE INVENTION

Technical Subject

The present invention for solving the technical problem is intended to provide a power conversion device and a solar module using a plurality of converters having a multi-level structure.

Technical Solution

In order to solve the above technical problem, a power conversion device according to one embodiment of the present invention comprises: a plurality of converters being connected to each of a plurality of cell strings; a voltage detection unit for detecting at least one of an input voltage and an output voltage of each of the plurality of converters; and a control unit for generating and applying a control signal for each of the plurality of converters by using the voltage detected by the voltage detection unit, wherein the plurality of converters constitutes a multi-level.

In addition, the voltage detection unit may include two resistors being connected in series between the input terminals or output terminals of each converter and the ground, and may detect a voltage being applied to a node between the two resistors.

In addition, the control unit may calculate the voltage being measured in each converter using the difference in voltages being detected from the neighboring converters of a lower level.

In addition, the control unit may calculate the voltage being measured in a converter of a lowest level as the voltage of the converter of the lowest level.

In addition, the control unit may calculate the voltage measured at the output terminal of the highest level converter as a total output voltage.

In addition, the voltage detection unit may include: two resistors being connected in series between input terminals or output terminals of a lower level converter adjacent to the input terminals or the output terminals of each of the converters; and a reference potential converter for converting a reference potential of a voltage being applied to a node between the two resistors into a reference potential equal to that of the control unit.

In addition, the plurality of converters may receive the control signal and perform maximum power point tracking control.

In addition, the plurality of converters may be connected in cascode In addition, the control unit may monitor at least one of input signals, output signals of the plurality of converters, and current flowing in inductors included in each converter, and transmit the monitored information to the outside through power line communication (PLC).

In addition, the control unit may individually generate a control signal for each of the plurality of converters corresponding to each cell string according to an output signal of each of the plurality of cell strings.

In addition, control signals for the plurality of converters may be applied in synchronization or applied with a predetermined phase difference.

In addition, the control signal may be a PWM signal for a switching element included in the converter.

In order to solve the above technical problem, a solar module according to an embodiment of the present invention comprises: a plurality of cell strings each including one or more solar cells; a plurality of converters being respectively connected to each of the cell strings; a voltage detection unit for detecting at least one of an input voltage and an output voltage of each of the plurality of converters; and a control unit for generating and applying a control signal for each of the plurality of converters using the voltage detected by the voltage detection unit, wherein the plurality of converters constitutes a multi-level.

In addition, the voltage detection unit includes two resistors being connected in series between the input terminals or output terminals of each converter and the ground, and detects a voltage being applied to a node between the two resistors, wherein the control unit may calculate the voltage being measured in each converter using the difference from the voltage being detected in a neighboring converter of a lower level.

In addition, the voltage detection unit may include: two resistors being connected in series between the input terminals or output terminals of each converter and the input terminals or output terminals of a neighboring lower level converter; and a reference potential conversion unit for converting the reference potential of the voltage being applied to a node between the two resistors into the same reference potential as the reference potential of the control unit.

Advantageous Effects

According to embodiments of the present invention, the number of control units can be reduced by controlling multiple converters with an integrated control unit. In addition, linked control is possible between each converter, and it is easy to implement additional functions such as monitoring and communication in addition to maximum power point tracking control using an integrated control unit. In addition, in detecting voltages having different reference potentials in the multilevel structure MLPE, the voltages can be detected only with the resistor divider circuit in the same manner as the conventional method without additional devices. Furthermore, in using MLPE having a multi-level structure, it is possible to smoothly supply auxiliary power to each DC/DC converter, control circuit, PLC circuit, and the like by implementing an auxiliary power circuit. Here, it is possible to generate a plurality of auxiliary power sources by applying a single isolated converter to the auxiliary power circuit, which is advantageous in reducing material costs. In addition, in using MLPE having a multi-level structure, a more stable auxiliary power supply is possible by having an individual auxiliary power circuit for each DC/DC converter, and when designing an individual auxiliary power circuit as a buck-boost type, it is possible to reduce material cost compared to non-inverting buck-boost converters by cascading a step-down regulator and a step-up regulator.

BRIEF DESCRIPTION OF DRAWINGS

FIGS. 13 and 14 are diagrams for explaining a second embodiment of the present invention.

BEST MODE

Figure 1:
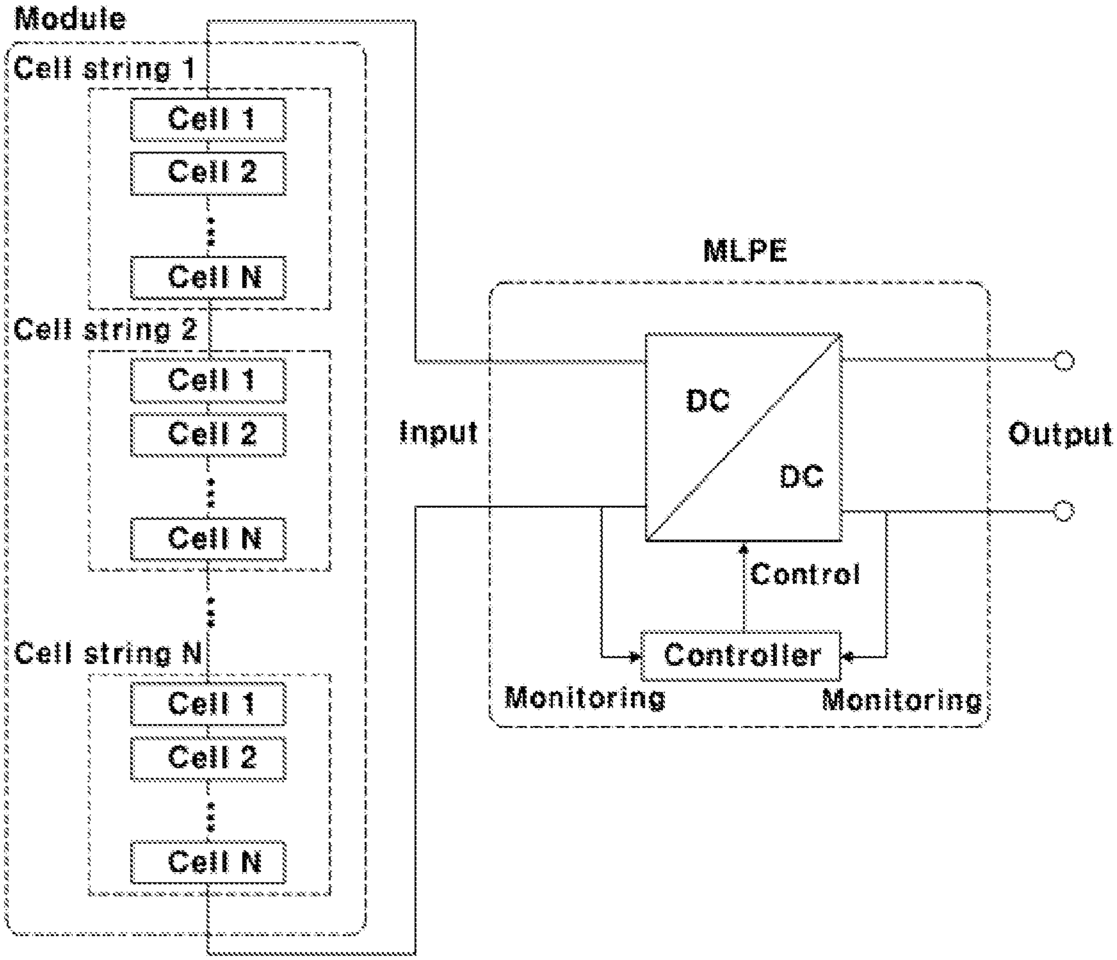
FIGS. 1 to 4 are block diagrams of solar modules according to comparative embodiments of the present invention.
Figure 2:
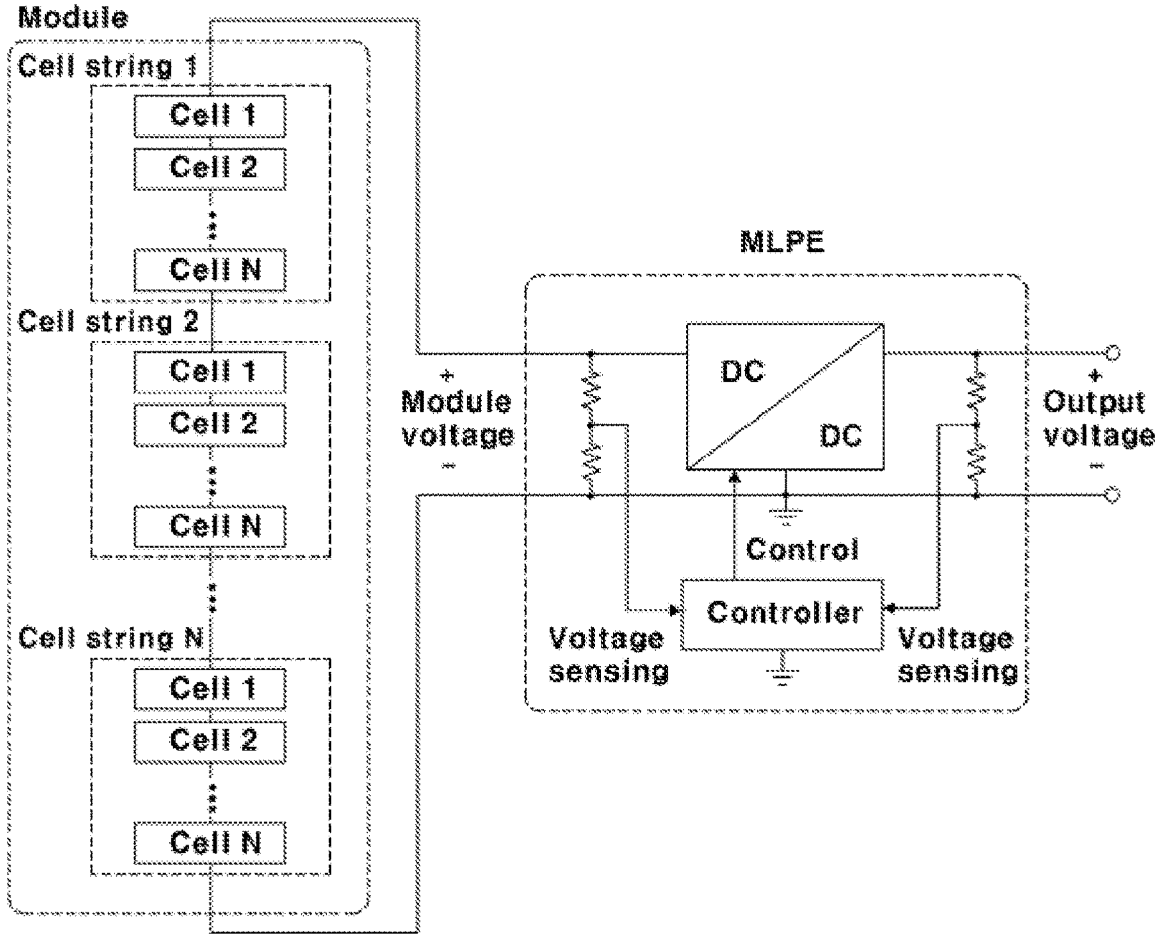

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as “at least one (or more than one) of a and b and c”, it may include one or more of all combinations that can be combined with a, b, and c.

In addition, in describing the components of the embodiment of the present invention, terms such as first, second, a, b, (a), and (b) may be used. These terms are merely intended to distinguish the components from other components, and the terms do not limit the nature, order or sequence of the components.

And, when a component is described as being ‘connected’, ‘coupled’ or ‘interconnected’ to another component, the component is not only directly connected, coupled or interconnected to the other component, but may also include cases of being ‘connected’, ‘coupled’, or ‘interconnected’ due that another component between that other components.

In addition, when described as being formed or arranged in “on (above)” or “below (under)” of each component, “on (above)” or “below (under)” means that it includes not only the case where the two components are directly in contact with, but also the case where one or more other components are formed or arranged between the two components. In addition, when expressed as "on (above)" or "below (under) ", the meaning of not only an upward direction but also a downward direction based on one component may be included.

Modified embodiments according to the present embodiment may include some components of each embodiment and some components of other embodiments together. That is, a modified embodiment may include one embodiment among various embodiments, but some components may be omitted and some components of other corresponding embodiments may be included. Or, it may be the other way around. Features, structures, effects, and the like to be described in the embodiments are included in at least one embodiment, and are not necessarily limited to only one embodiment. Furthermore, the features, structures, and effects illustrated in each embodiment can be combined or modified with respect to other embodiments by those skilled in the art in the field to which the embodiments belong. Therefore, contents related to these combinations and modifications should be construed as being included in the scope of the embodiments.

Figure 6:
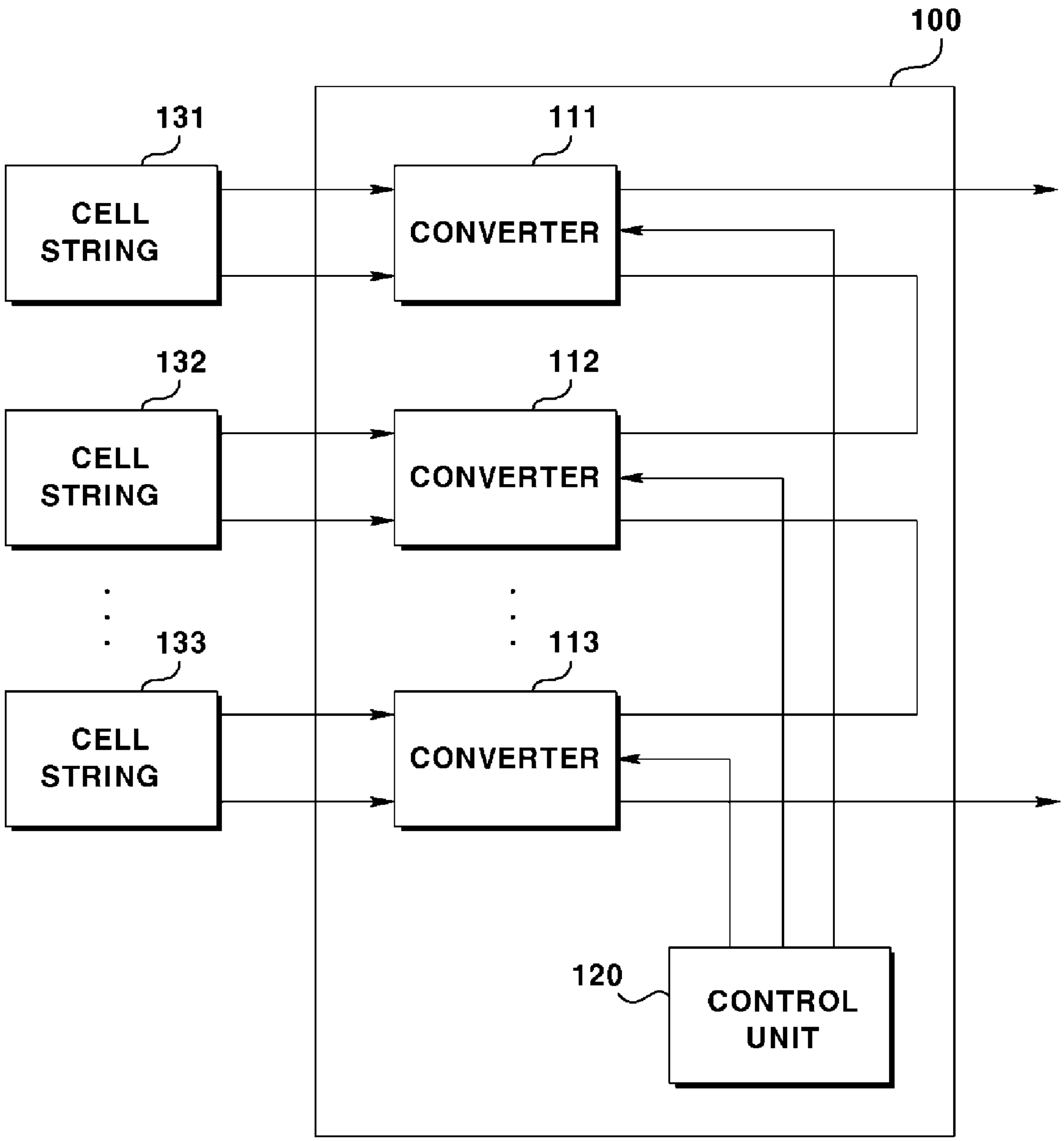
FIG. 6 is a block diagram of a power conversion device according to a first embodiment of the present invention.
Figure 7:
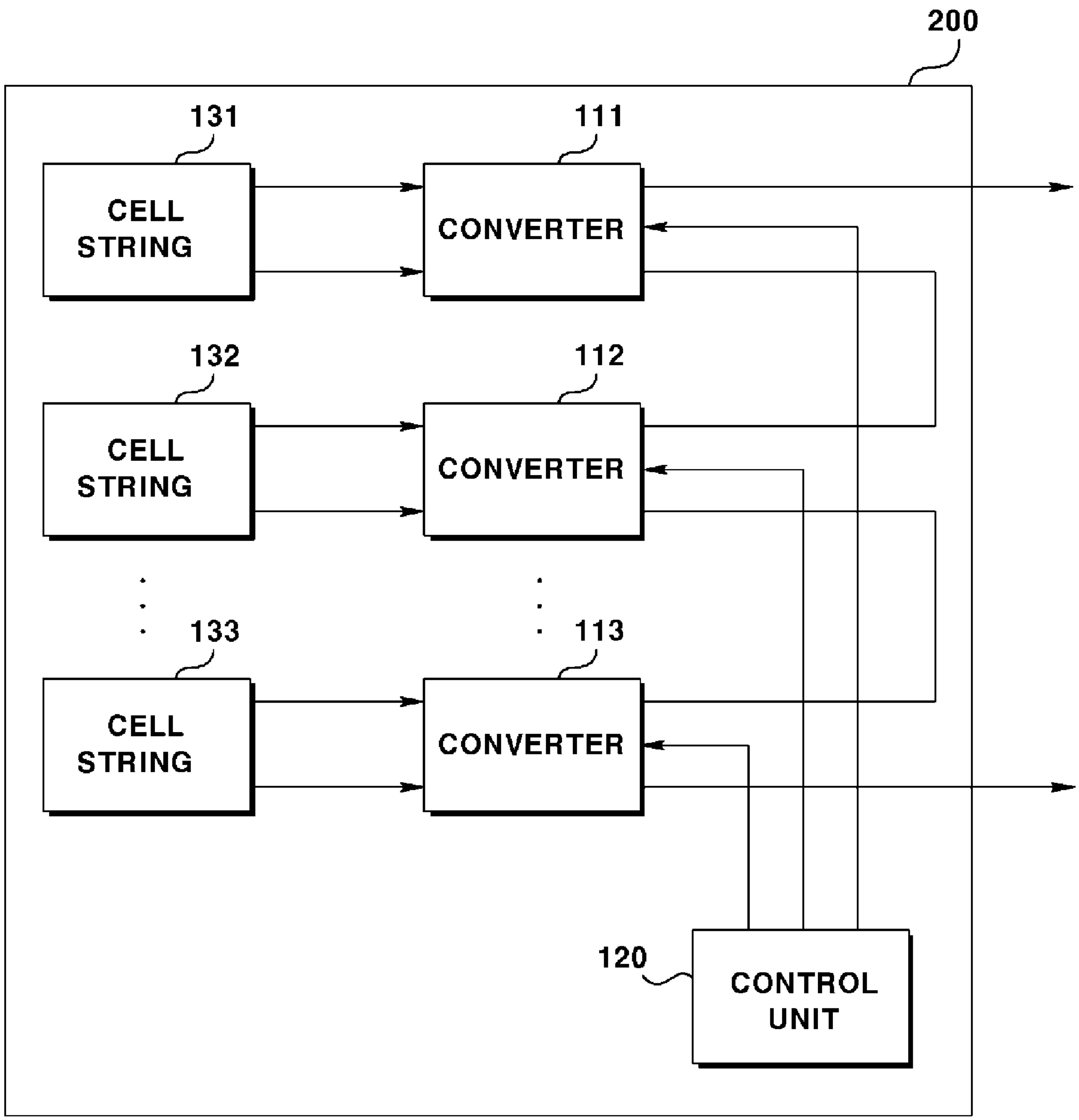
FIG. 7 is a block diagram of a solar module according to a first embodiment of the present invention.

FIG. 6 is a block diagram of a power conversion device according to a first embodiment of the present invention; FIG. 7 is a block diagram of a solar module according to a first embodiment of the present invention; and FIGS. 8 to 10 are views for explaining a first embodiment of the present invention.

FIG. 6 is a block diagram of a power conversion device according to a first embodiment of the present invention.

FIG. 7 is a block diagram of a solar module according to a first embodiment of the present invention.

Figure 8:
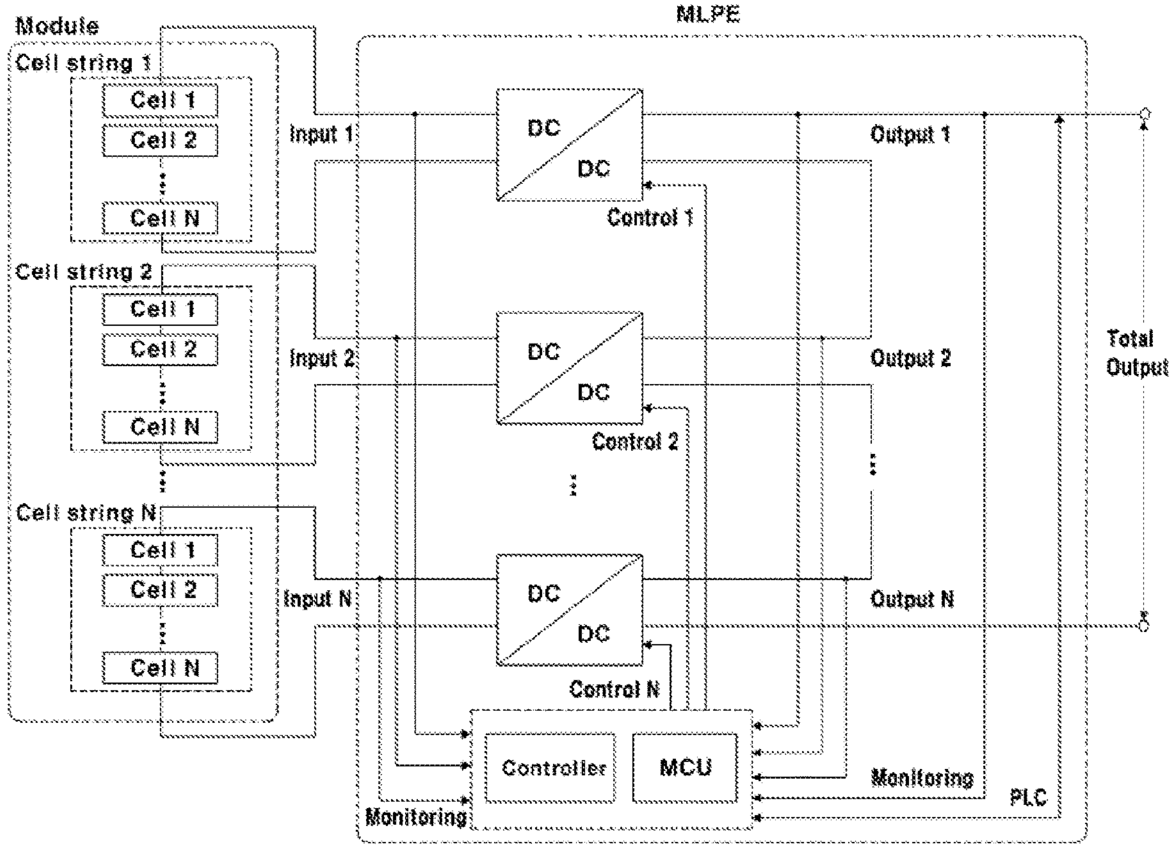
FIGS. 8 to 10 are views for explaining a first embodiment of the present invention.
Figure 9:
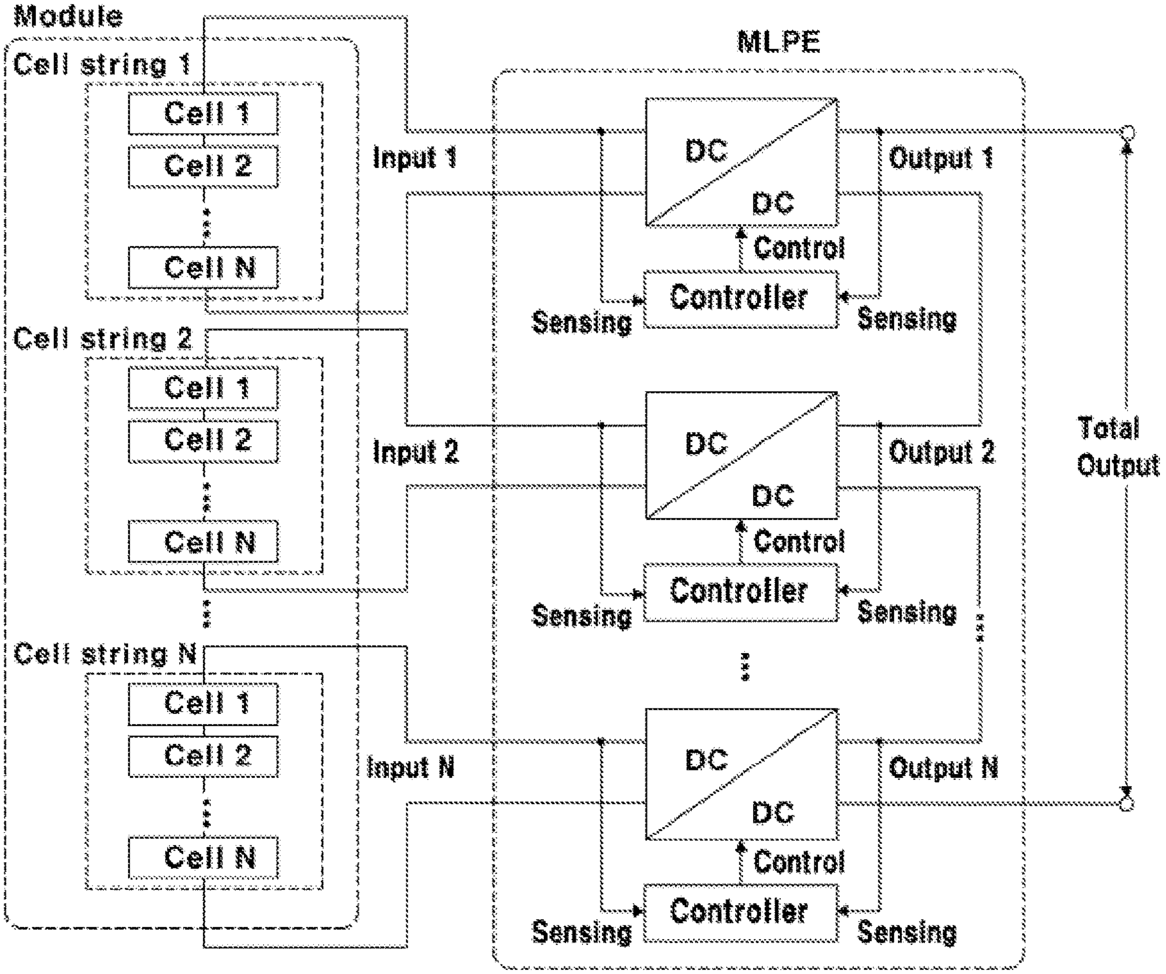
Figure 10:
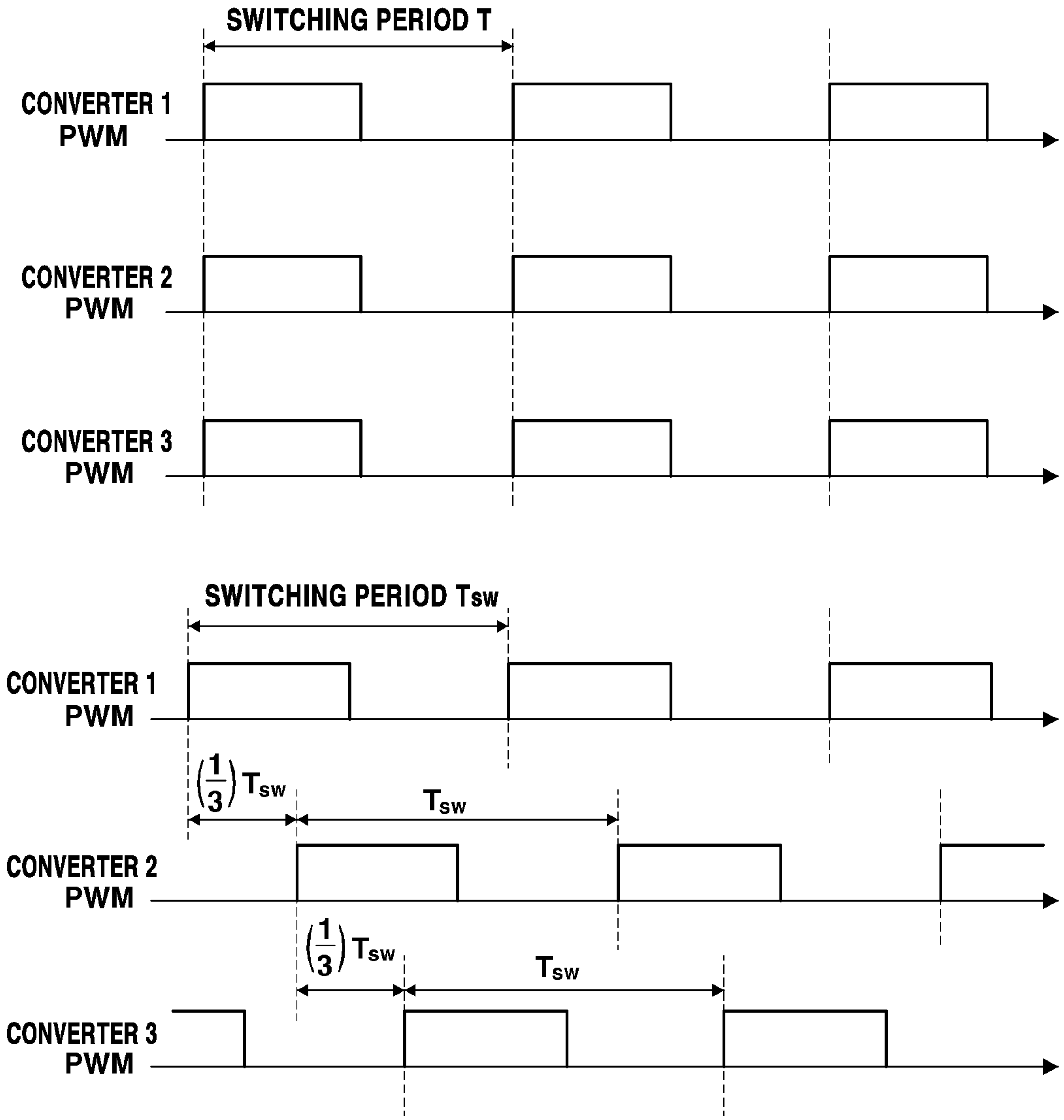

FIGS. 8 to 10 are views for explaining a first embodiment of the present invention.

The power converter 100 according to a first embodiment of the present invention is composed of a plurality of cell strings 131 to 133, a plurality of converters 111 to 113, and a control unit 120.

Converters 111 to 113 are respectively connected to a plurality of cell strings 131 to 133.

Here, each of the plurality of cell strings 131 to 133 may include at least one cell, and when including a plurality of cells, the plurality of cells may be connected in series. The cell strings 131 to 133 may be solar cell strings including solar cells. A string of solar cells may form a solar panel. A solar cell performs solar power generation (pv, photovoltaic) that generates power using the photoelectric effect. The photoelectric effect is the emission of electrons when light of a certain frequency or higher hits a specific metal material. A pn junction is formed using a p-type semiconductor and an n-type semiconductor, and electric power is generated by using electrons generated by the photoelectric effect to generate current. A solar cell is formed using silicon or the like and may be formed in a wafer form. The solar cell is located in a field that can receive sunlight well, an outer wall of a building, or a rooftop, and generates electric power using sunlight. At this time, the solar cell may be formed of building-integrated solar power generation (bipv) being formed integrally with the building.

Since the size of the power generated by one solar cell is not enough to be used in the load or power system, power of a size suitable for use may be generated by connecting a plurality of solar cells in series instead of one solar cell to form a solar cell string. A string of solar cells may be a basic unit for generating electrical power. A solar power generation panel can be formed by forming a plurality of cell strings, which are basic units, into a panel.

Figure 5:
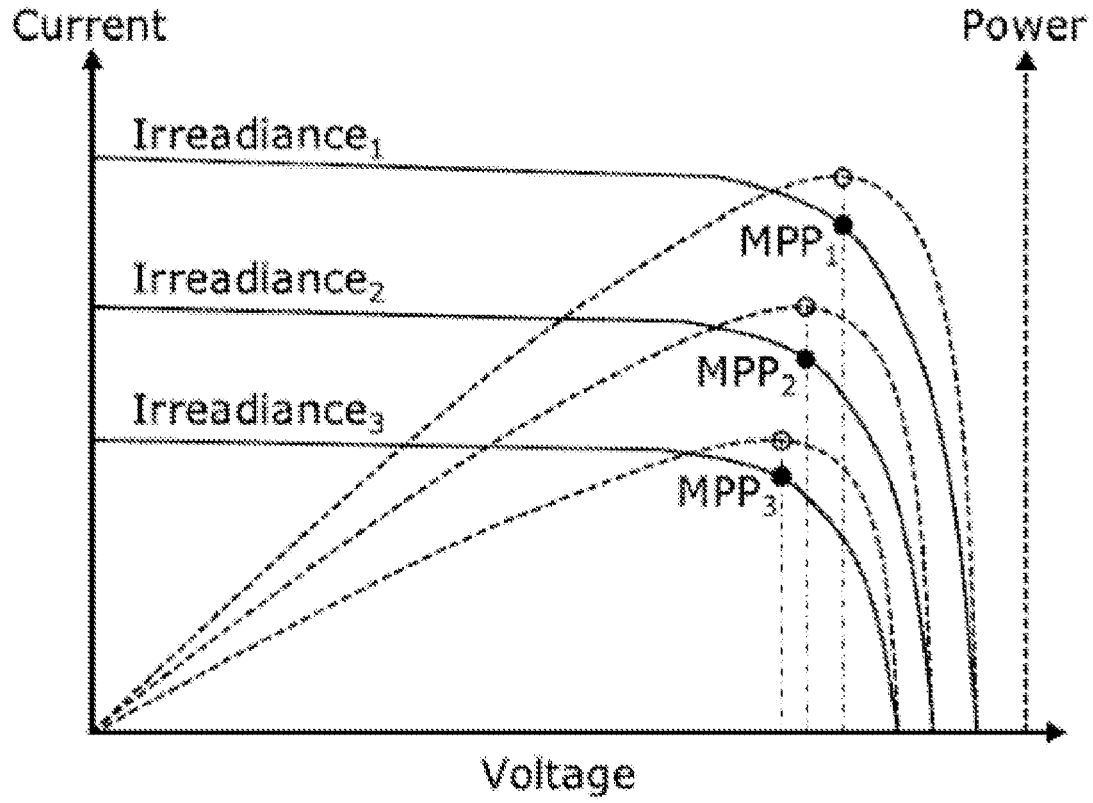
FIG. 5 is a diagram for explaining maximum power point tracking control.

As shown in FIG. 5, solar cells have different voltage-current characteristics depending on the amount of sunlight, temperature, and the like, and the maximum power point (mpp) also varies. (generated power=voltage×current) the power conversion device controls the solar cell to operate at the maximum power point (mpp), which is the operating point at which the solar cell has the maximum power under each condition. This is called maximum power point tracking (mppt), and the efficiency of solar power generation can be increased by using maximum power point tracking. In solar power generation, depending on the characteristics of the relationship between current and voltage and voltage and power, the maximum power may be about 80% of the maximum voltage, not the maximum voltage. Since such a maximum power point continuously changes according to the magnitude of the voltage and current generated by the solar panel, it is necessary to continuously find a point where the maximum power point can be generated. That is, in order to follow the maximum power rather than the maximum voltage, the magnitudes of the voltage and current may be varied so as to reach the maximum power. That is, the voltage may be decreased and the current may be increased, or the voltage may be increased and the current may be decreased in the direction of increasing power.

The converter includes a plurality of converters 111 to 113 corresponding to the number of the plurality of cell strings 111 to 113. Each of the converters 111 to 113 is connected to the corresponding cell strings 131 to 133 to receive power being generated from the cell strings 131 to 133, converts the voltage, and outputs the converted voltage. As shown in FIG. 1, when all cell strings are connected in series and maximum power point tracking control is performed using one converter, when there is a difference in the amount of sunlight between cell strings, it is difficult to follow the optimal maximum power point. For efficient maximum power point estimation control, a plurality of converters respectively connected to a plurality of cell strings are included in order to perform maximum power point tracking in units of cell strings.

The converters 111 to 113 are dc-dc converters, and may convert a signal having a first voltage into a signal having a second voltage and output the converted signal. Or, it may convert a signal having a first current into a signal having a second current and then output. At this time, a plurality of converters 111 to 113 constitutes a multi-level. The plurality of converters 111 to 113 may be connected in cascode to form a multilevel. Here, the cascode means a form in which output terminals are connected in multiple stages, and the output terminals of the converter are piled up according to the cascode connection to form multi-levels. Multi-level refers to a structure in which the output signals of each converter are combined and output as one signal. At this time, as shown in FIG. 6, the (−) terminal of the output terminal of the converter 111 of the upper level is sequentially connected to the (+) terminal of the output terminal of the converter 112 of the neighboring lower level so that the outputs from the converter 111 of the highest level to the converter 113 of the lowest level are combined and outputted as one signal.

The control unit 120 applies a control signal to each of the plurality of converters 111 to 113. One control unit 120 generates a control signal for controlling each of the plurality of converters 111 to 113. The plurality of converters 111 to 113 receive the control signal and perform maximum power point tracking control.

Each of the plurality of converters 111 to 113 receives a control signal from the control unit 120 and performs maximum power point tracking so that the power of the cell strings 131 to 133 connected to each other becomes the maximum power. When a solar module formed of a plurality of cell strings is formed over a certain area, since the maximum power point between the cell strings becomes different when the amount of sunlight is different between the cell strings, each of the plurality of converters performs maximum power point tracking control for each cell string so that a maximum power is generated in each cell string. Through this, maximum power point tracking control optimized for each cell string is possible.

The control unit 120 may additionally perform other functions as well as a function of generating a control signal for maximum power point tracking control and applying the control signal to the plurality of converters 111 to 113. The control unit 120 may monitor at least one of input signals and output signals of the plurality of converters 111 to 113 and current flowing through inductors included in each converter. In generating the control signal for maximum power point tracking control, since the input signal of the converter corresponding to the cell string voltage being outputted from the cell strings 131 to 133 and the output signal being outputted from the converter should be used, the control unit 120 monitors the input signal and output signal of the converter. At this time, the voltage and current of the input signal and the voltage and current of the output signal can be monitored. In addition, current flowing in the inductors constituting the converters 111 to 113 may be monitored to monitor whether or not overcurrent flows, and may be used for overcurrent protection. In addition, the control unit 120 may monitor various kinds of information required for power conversion.

The control unit 120 may transmit the monitored information to an upper controller or the outside. At this time, the control unit 120 may transmit monitored information through power line communication (plc). Power line communication is communication using a power line, and communication can be performed using a power line without a separate communication line. In addition, it is natural that various types of communication such as wired or wireless type can be used.

The control unit 120 may include: a first control unit for applying a control signal so that the plurality of converters 111 to 113 perform maximum power point tracking control; and a second control unit configured to monitor at least one of input signals and output signals of the plurality of converters and current flowing in inductors included in each converter, and to transmit the monitored information to the outside. The control unit 120 may include: a first control unit for performing the maximum power point tracking control function for each function; and a second control unit for performing functions of monitoring and communication. At this time, the first control unit and the second control unit may be formed as one module or as separate modules. The first control unit and the second control unit may be formed for each functional block or may be formed as one integrated ic.

FIG. 8 illustrates an implementation example of a first embodiment of the present invention, and the power conversion device 100 may be an mlpe. Maximum power point tracking control is possible for each cell string by controlling a plurality of converters constituting a multi-level using one control unit. As shown in FIG. 8, an mcu for monitoring information for maximum power point tracking control and for communicating the monitored information to the outside world and controller function that performs maximum power point tracking control and applies control signals to each converter can be formed as one control unit. It is natural that it can be formed as a separate functional block or module on one control unit.

FIG. 9 is an embodiment including a plurality of controllers controlling each converter constituting a multi-level. Since a separate controller is required for each converter, the number of controllers increases, cost increases, and manufacturing may become difficult. At this time, a separate mcu is also required for monitoring or communication. Compared to the embodiment of FIG. 9, as in the embodiment of FIG. 8, efficient control becomes possible by controlling each of the converters 111 to 113 from one control unit 120.

The control unit 120 individually generates a control signal for each of the plurality of converters corresponding to each cell string according to an output signal of each of the plurality of cell strings, thereby enabling the maximum power point tracking of each cell string.

The converters 111 to 113 may include a plurality of switching elements, and here, the switching elements may include semiconductor switches such as mosfets. The control signal may be a pulse-width modulation (pwm) signal for driving the semiconductor switches in the converters 111 to 113. The pwm signal is a signal whose pulse width is adjusted during one cycle. The larger the pulse width, the longer the time for the switching element to remain turned on. That is, the duty ratio increases, and the magnitude of power transmitted from the converters 111 to 113 to the output increases. Conversely, when the pulse width is reduced, the duty ratio is reduced, and thus the magnitude of power transmitted from the converters 111 to 113 to the output is reduced. By adjusting this, voltage and current can be controlled, and through this, maximum power point tracking control becomes possible. That is, the control unit 120 may perform maximum power point tracking control by adjusting the magnitude of the pwm signal.

When the control unit 120 applies control signals to the plurality of converters 111 to 113, the control signals to the plurality of converters may be applied in synchronization or with a predetermined phase difference. Since one control unit 120 controls the plurality of converters 111 to 113, linked control between the respective converters becomes possible. For example, each converter may operate in a synchronization method or an interleaving method as shown in FIG. 10. As shown in FIG. 10, the synchronization method is to simultaneously apply a control signal to each converter at the same time, and in the interleaving method, a control signal is applied with a phase difference for each converter. When applying interleaving method, adc or operation of the mcu, which is a control unit, is not concentrated at one point but is distributed, so that a lower performance mcu can be applied. The phase difference may vary according to the number of converters constituting the multilevel. For example, when there are 3 converters, 360 degrees is divided by 3, and control signals for each converter may be applied with a phase difference of 120 degrees.

As shown in FIG. 7, the solar module according to a first embodiment of the present invention includes a plurality of cell strings 131 to 133, a plurality of converters 111 to 113 and a control unit 120. The detailed description of the solar module of FIG. 7 corresponds to the detailed description of a power conversion device according to a first embodiment, and overlapping descriptions will be omitted. Each of the plurality of cell strings 131 to 133 includes one or more solar cells, the plurality of converters 111 to 113 is respectively connected to the cell strings, and the control unit 120 is a control unit for monitoring information of each of the plurality of converters 111 to 113 and applying a control signal to each of the plurality of converters 111 to 113 according to the monitored information. The plurality of converters constitutes a multi-level.

The plurality of converters 111 to 113, connected in cascode, and the control unit 120 may be an integrated is that applies a control signal so that the plurality of converters 111 to 113 perform maximum power point tracking control and monitors at least one of input signals and output signals of the plurality of converters 111 to 113 and current flowing in inductors included in each converter, and transmits the monitored information to the outside.

Figure 11:
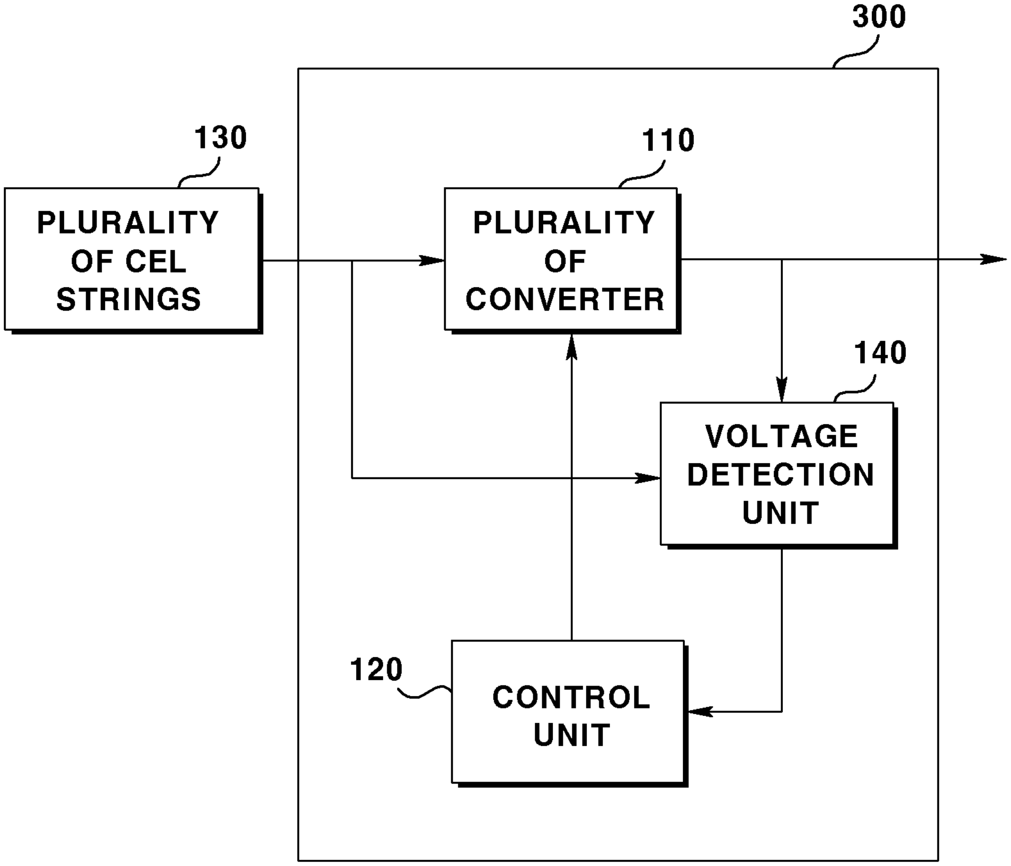
FIG. 11 is a block diagram of a power conversion device according to a second embodiment of the present invention.
Figure 12:
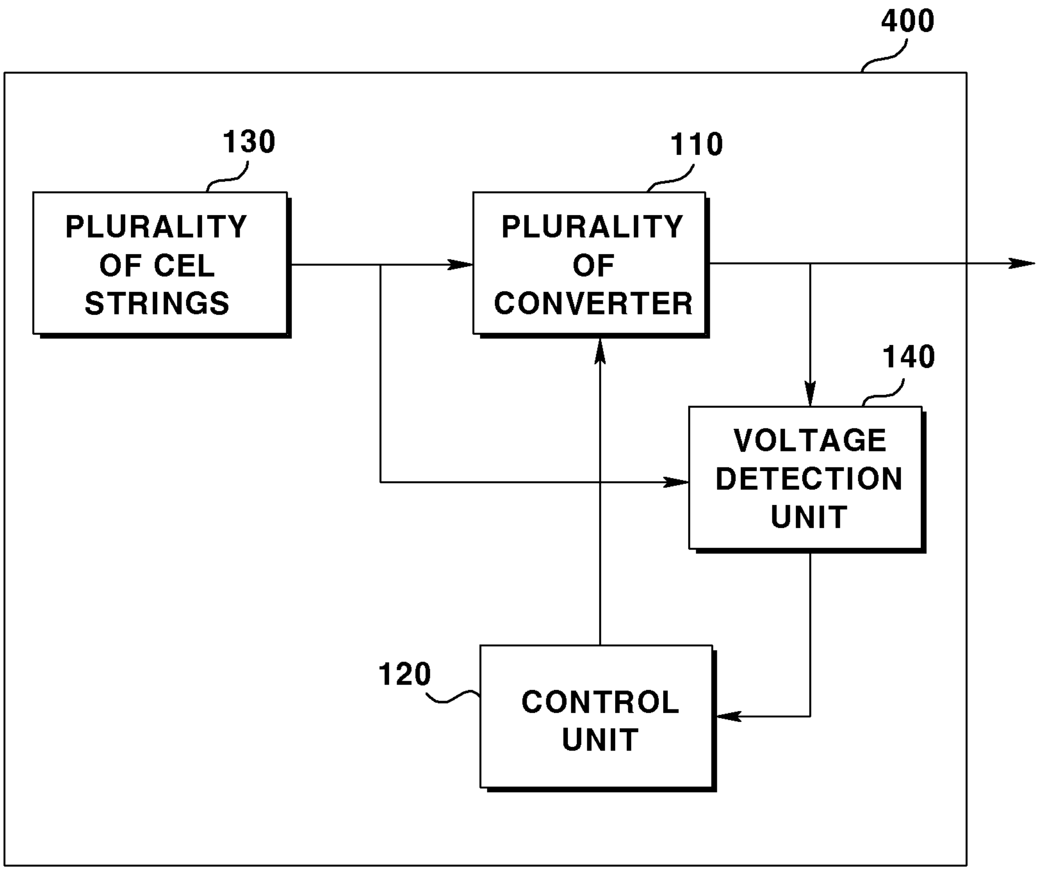
FIG. 12 is a block diagram of a solar module according to a second embodiment of the present invention.
Figure 13:
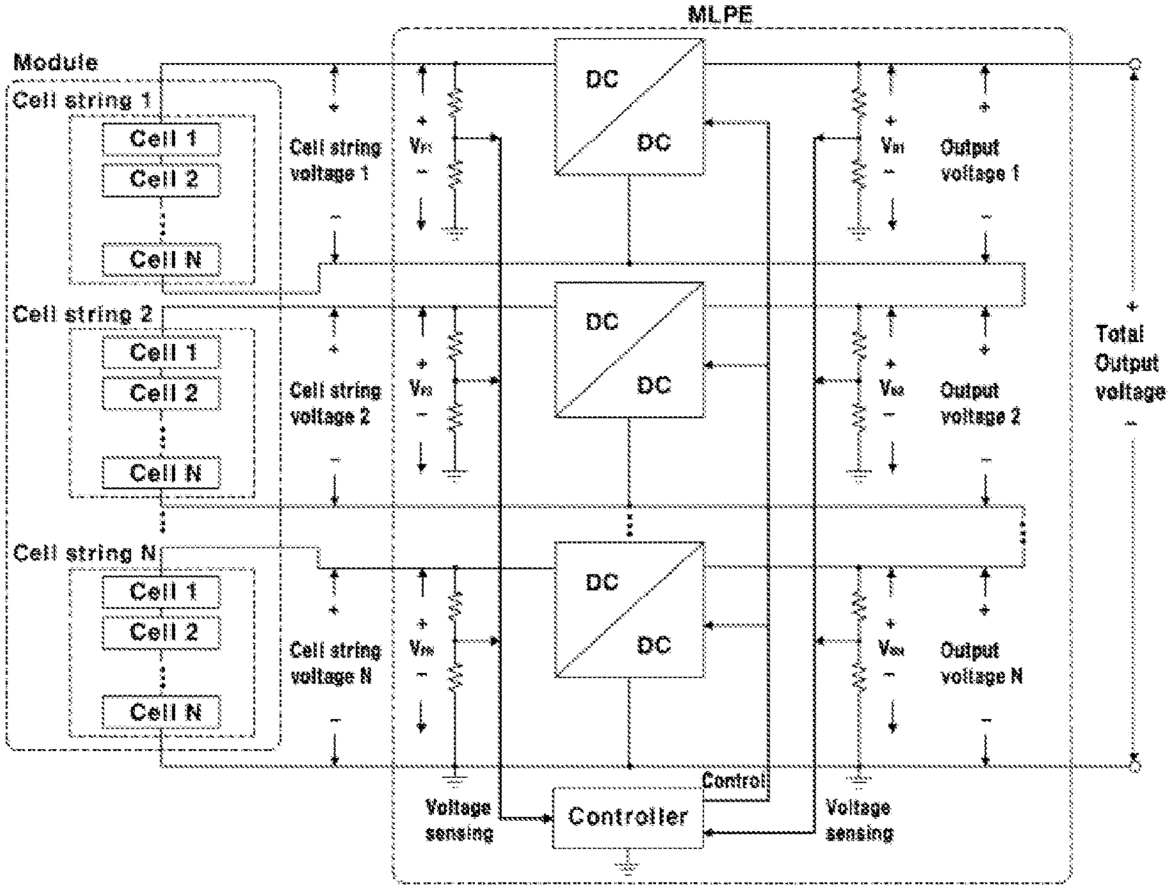

FIG. 11 is a block diagram of a power conversion device according to a second embodiment of the present invention; and FIG. 12 is a block diagram of a solar module according to a second embodiment of the present invention. FIGS. 13 and 14 are diagrams for explaining a second embodiment of the present invention.

The power converter 300 according to a second embodiment of the present invention is composed of a plurality of converters 110, a voltage detection unit 140, and a control unit 120. Among the detailed description of the power conversion device according to a second embodiment of the present invention, the description corresponding to the detailed description of a first embodiment will be omitted. The second embodiment of the present invention mainly expresses the configuration for detecting the cell string output voltage and the converter output voltage in the converter 110 constituting the multi-level, so it is natural that configurations according to embodiments of the present invention may be included even if descriptions of some configurations are omitted.

The plurality of converters 110 is respectively connected to the plurality of cell strings 130 and is connected in cascode to configure multi-level. Signals from the highest level to the lowest level being outputted from the plurality of converters 110 are combined and outputted as one signal.

The voltage detection unit 140 detects at least one of an input voltage and an output voltage of each of the plurality of converters 110. The voltage detection unit 140 is formed at each input terminal and output terminal of a plurality of converters to detect voltage at each position.

The voltage detection unit 140 includes two resistors connected in series between the input terminal or output terminal of each converter and the ground, and can detect a voltage applied to a node between the two resistors. As shown in FIG. 13, the voltage at a corresponding location where the voltage is to be measured, that is, between the input terminal or output terminal of each converter and the ground is detected using voltage division according to two resistors being connected in series.

The control unit 120 generates and applies a control signal to each of the plurality of converters 110 using the voltage detected by the voltage detection unit 140. Since the voltage detection unit 140 detects through voltage distribution with respect to ground, at a higher level not a voltage at the lowest level where ground is the reference potential, accurate voltage detection is difficult because the reference potential is different. Accordingly, the control unit 120 receives the voltage detected by each voltage detection unit 140 and calculates the voltage at each level using the relationship at each level.

The control unit 120 calculates the voltage measured in the converter of the lowest level as the voltage of the converter of the lowest level. Since the reference potential of the lowest level is ground which is the same as the reference potential of the voltage detection unit 140, the voltage measured by the converter of the lowest level can be used as it is. The voltage measured at the output terminal of the converter of the highest level can be calculated as the total output voltage. Since the voltage between the output terminal of the converter of the highest level and the ground is the same as the total output voltage, the voltage measured at the highest level can be used as it is without separately detecting the total output voltage.

As for the detected voltage at a level other than the lowest level, the voltage at the corresponding level is calculated using the difference from the voltage measured at the neighboring lower level.

As shown in FIG. 14, the control unit 120 may calculate the voltage at each level. As shown in FIG. 13, the cell string voltages measured at the input terminal in order of level are vf1, vf2, and vf3, when the output voltage measured at the output terminal is vb1, vb2, and vb3, cell string voltage 1 can be calculated as vf1−vf2, cell string voltage 2 can be calculated as vf2−vf3, and cell string voltage 3 can be calculated as vf3 as it is. In addition, output voltage 1 can be calculated as vb1−vb2, output voltage 2 can be calculated as vb2−vb3, output voltage 3 can be calculated as vb3 as it is, and the total output voltage can be calculated as corresponding to vb1.

Figure 15:
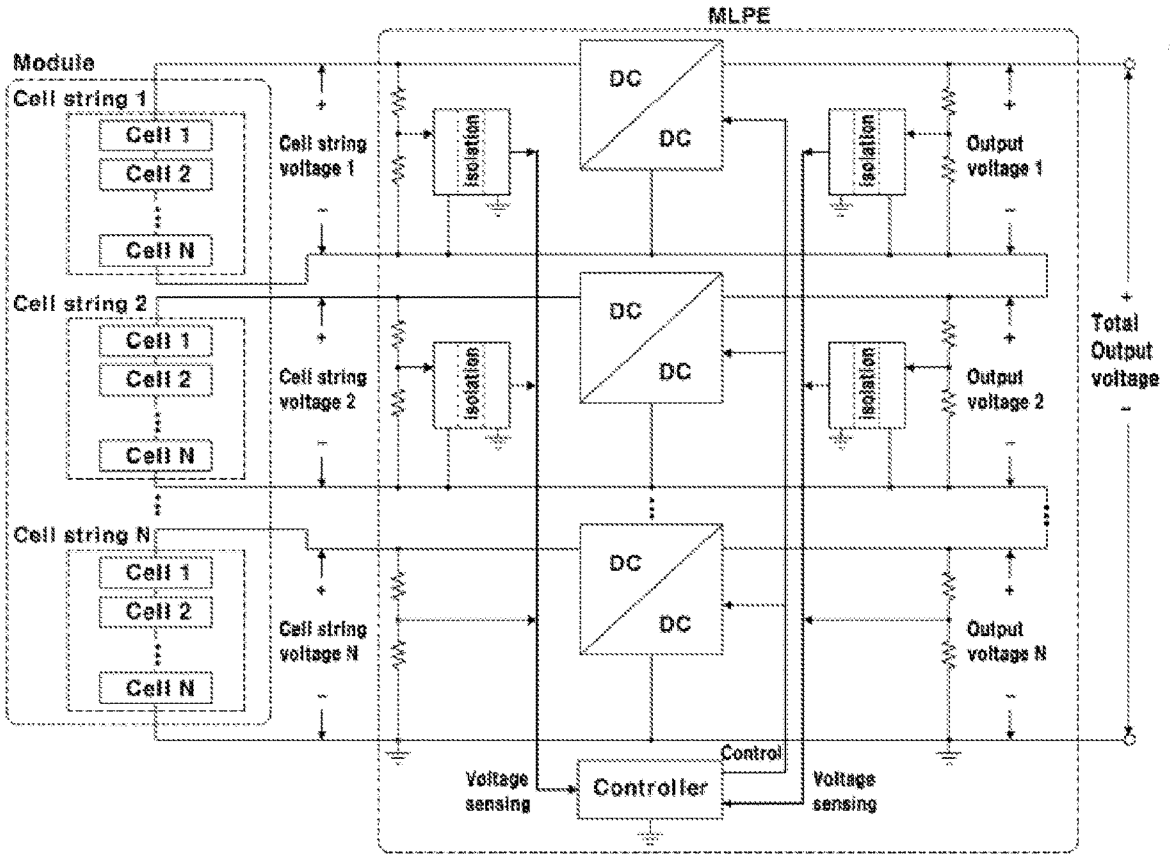
FIG. 15 illustrates another embodiment of a power converter according to a second embodiment of the present invention.

Voltage detection unit 140 can also measure the voltage between the adjacent input terminals or output terminals not between the input terminal or output terminal and the ground where the voltage is to be measured. At this time, the voltage detection unit 140 may include a reference potential conversion unit converting the reference potential of the voltage applied to the node between the two resistors being connected in series between the input terminals of lower level converter neighboring with the input terminal or the output terminal of each converter to the same reference potential as the reference potential of the control unit. As shown in FIG. 15, in measuring voltage, the voltage may be measured using a reference level of a neighboring lower level rather than the ground level.

As shown in FIG. 15, mlpe, which is a power conversion device constituting multi-levels in cascode, has different reference potentials in each level composed of a cell string and a converter corresponding thereto. That is, the lowest level has the lowest reference potential, and the higher levels have higher reference potentials. In general, the lowest level reference potential can be ground. Since the controller, which is a control unit, is designed to detect only a potential difference higher than its own reference potential, in this multi-level structure, the reference potential of the controller is arranged the same as that of the lowest level. In this multi-structure and controller arrangement, the controller can detect voltage only with a potential difference from its own reference potential. Accordingly, the cell string voltage of the lowest level having the same reference potential and the converter output voltage can be detected only by the resistor divider circuit. However, since the other upper levels have different reference potentials, a reference potential conversion unit such as a separate circuit that converts the resistance-divided voltage at each reference potential to the same reference potential as the controller is required.

At this time, since the reference potential in the controller, which is the control unit 120, is different from the reference potential at other levels except for the lowest level, a reference potential conversion unit for converting it into the same reference potential is included. The reference potential conversion unit may make the reference potential equal to the reference potential of the control unit 120 with respect to a value at a lower level adjacent to the ground. In addition, the reference potential of the voltage detected by the voltage detection unit may be adjusted to match the reference potential of the control unit 120 using various elements or circuits.

The control unit 120 generates and applies a control signal to each of the plurality of converters 110 using the voltage detected by the voltage detection unit 140. The control unit 120 may individually generate a control signal for each of the plurality of converters corresponding to each cell string according to an output signal of each of the plurality of cell strings. The plurality of converters 110 may receive the control signal and perform maximum power point tracking control.

Control signals for the plurality of converters may be applied in synchronization or applied with a predetermined phase difference. At this time, the control signal may be a pwm signal for a switching element being included in the converter.

The control unit 120 monitors at least one of input signals and output signals of the plurality of converters, and current flowing in inductors included in each converter, and may transmit the monitored information to the outside through power line communication (plc).

As shown in FIG. 12, the solar module according to a second embodiment of the present invention includes a plurality of cell strings 130, a plurality of converters 110, a voltage detection unit 140, and a control unit 120. The detailed description of the solar module of FIG. 12 corresponds to the detailed description of the power conversion device according to a second embodiment, so overlapping descriptions will be omitted.

Each of the plurality of cell strings 130 includes one or more solar cells, and the plurality of converters 110 are connected to each of the cell strings to form a multi-level structure. The voltage detection unit 140 detects at least one of the input voltage and output voltage of each of the plurality of converters, and the controller 120 generates and applies a control signal to each of the plurality of converters using the voltage detected by the voltage detection unit 140.

The voltage detection unit 140 includes two resistors being connected in series between the input terminal or output terminal of each converter and the ground and detects the voltage being applied to a node between the two resistors, wherein the control unit 120 may calculate the voltage being measured in each converter by using the voltage difference with the voltage being detected in the neighboring lower-level converter.

Or, the voltage detection unit 140 may include a reference potential conversion unit converting the reference potential of the voltage applied to the node between the two resistors being connected in series between the input terminals of lower level converter neighboring with the input terminal or the output terminal of each converter to the same reference potential as the reference potential of the control unit.

Figure 16:
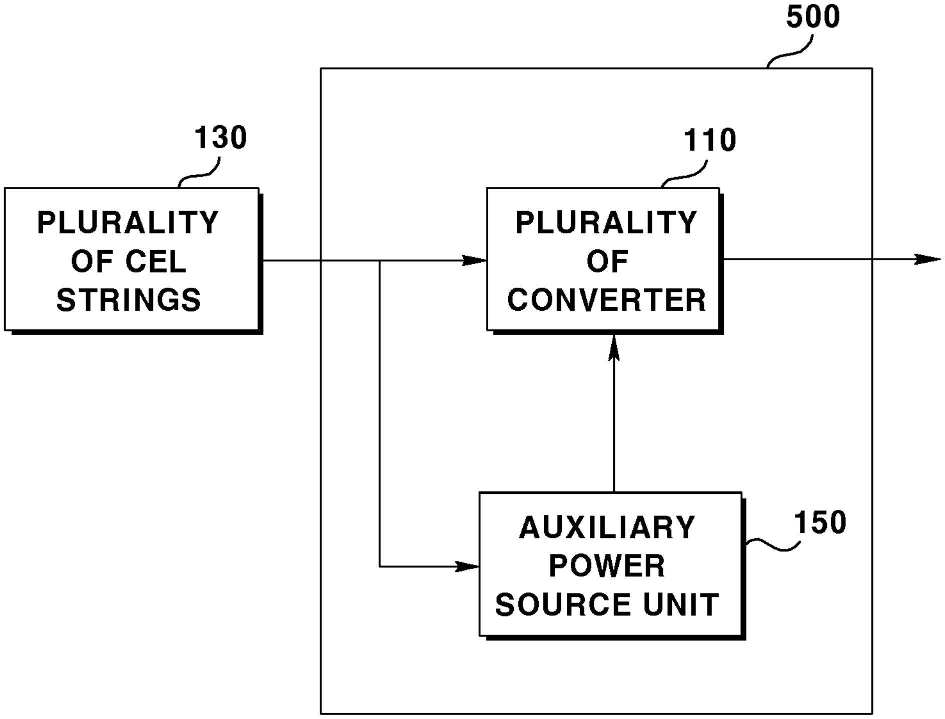
FIG. 16 is a block diagram of a power conversion device according to a third embodiment of the present invention.
Figure 17:
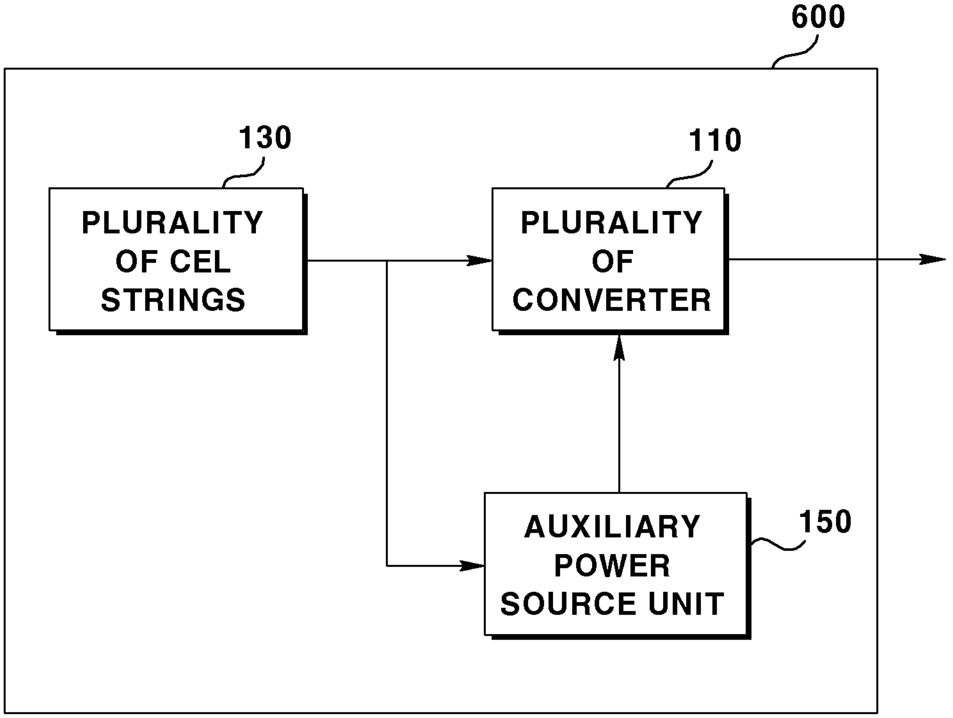
FIG. 17 is a block diagram of a solar module according to a third embodiment of the present invention.
Figure 18:
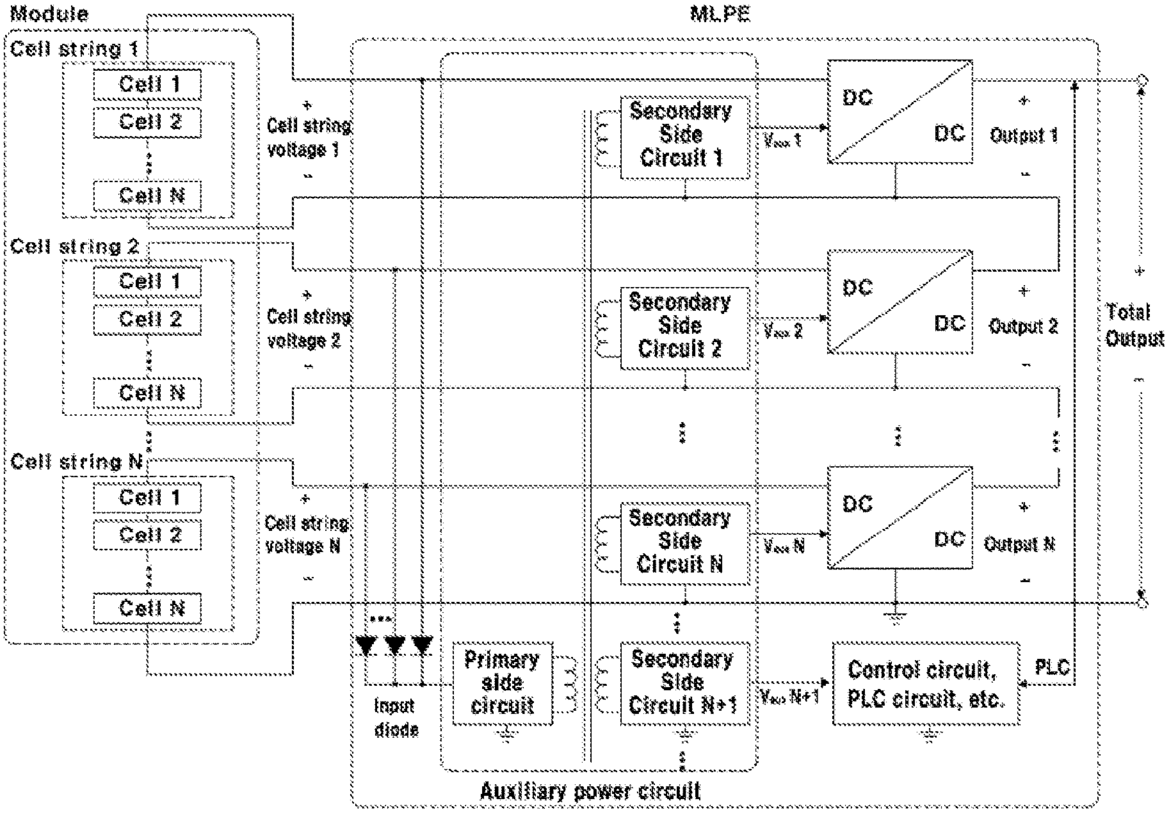
FIGS. 18 and 19 illustrate various embodiments of a power conversion device according to a third embodiment of the present invention.
Figure 19:
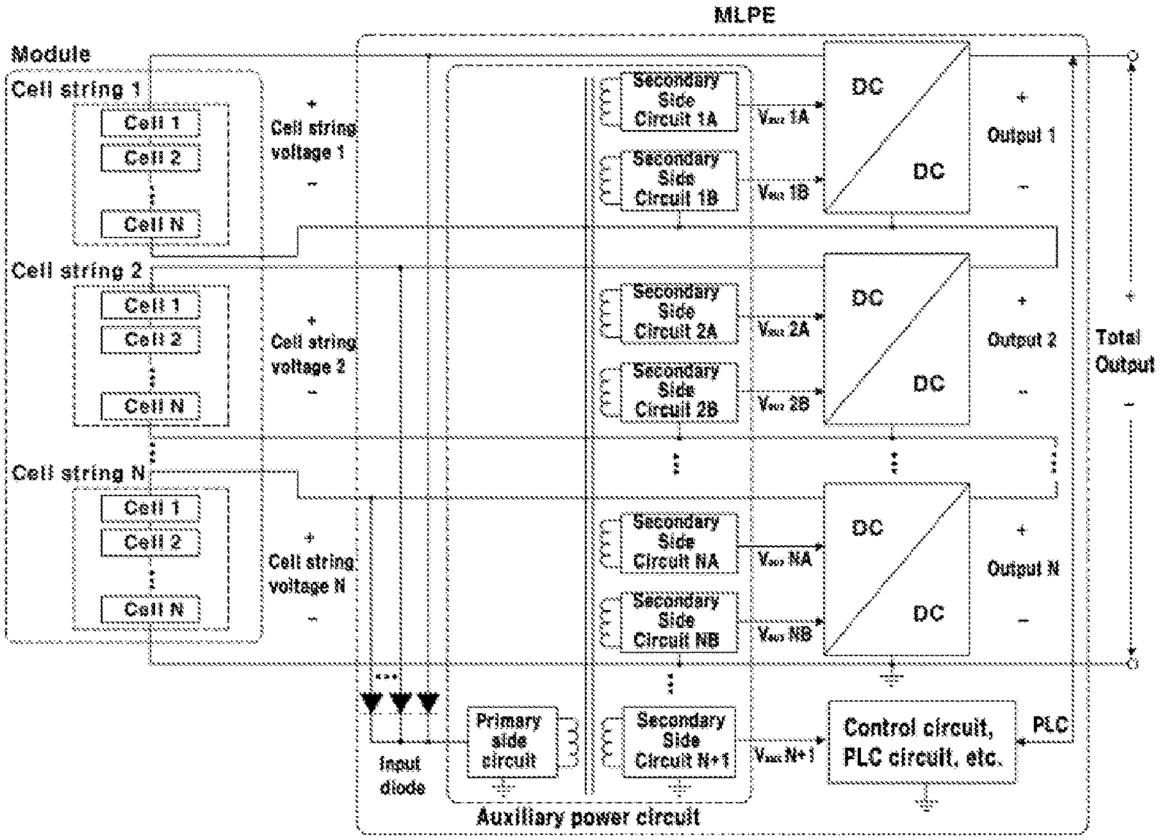

FIG. 16 is a block diagram of a power conversion device according to a third embodiment of the present invention; and FIG. 17 is a block diagram of a solar module according to a third embodiment of the present invention. FIGS. 18 and 19 illustrate various embodiments of a power conversion device according to a third embodiment of the present invention.

The power conversion device 500 according to a third embodiment of the present invention includes a plurality of converters 110 and an auxiliary power supply unit 150, and may further include a control unit or a voltage detection unit. Among the detailed descriptions of the power conversion device according to a third embodiment of the present invention, descriptions corresponding to the detailed descriptions of the first and/or second embodiments will be omitted. The third embodiment of the present invention describes focused on the configuration of the auxiliary power supply unit that generates auxiliary power to drive the converter, and the like, so even if descriptions of some configurations are omitted, it is natural that configurations according to the embodiments of the present invention may be included.

The plurality of converters 110 are respectively connected to the plurality of cell strings 130 and are connected in cascode to configure multi-level. Signals from the highest level to the lowest level being outputted from the plurality of converters 110 are combined and output as one signal.

Figure 3:
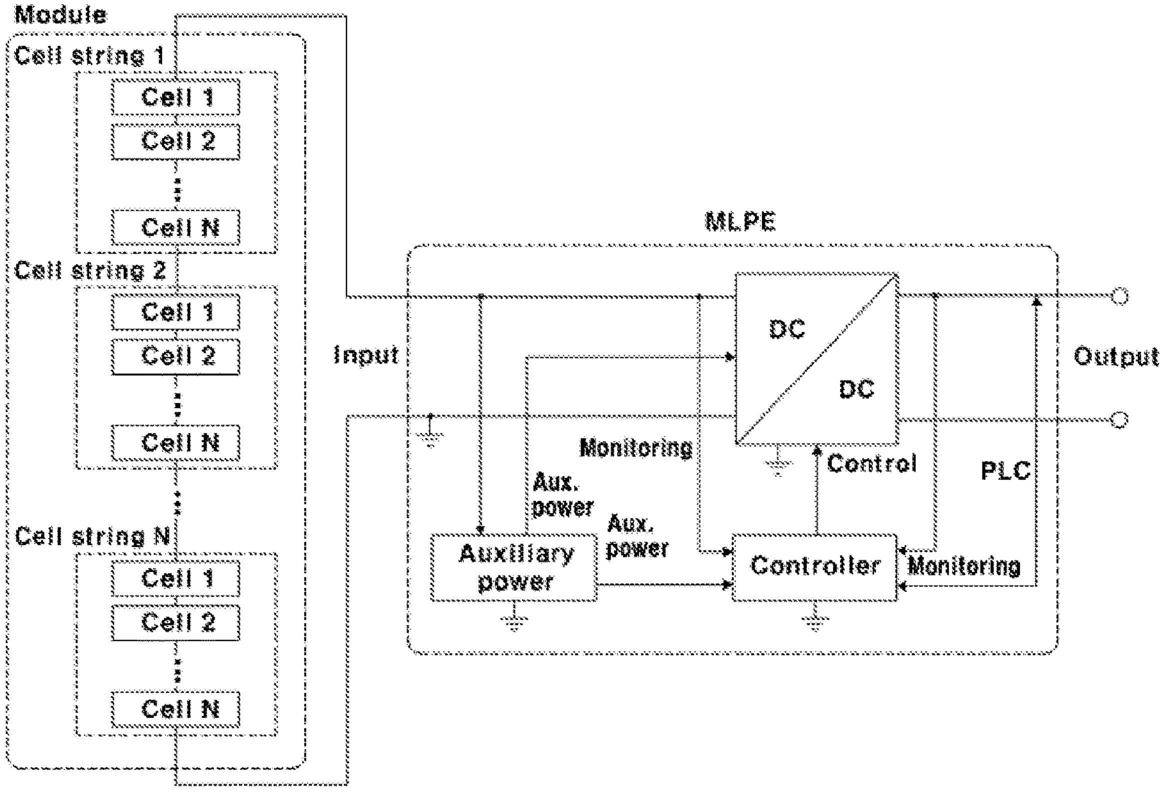
Figure 4:
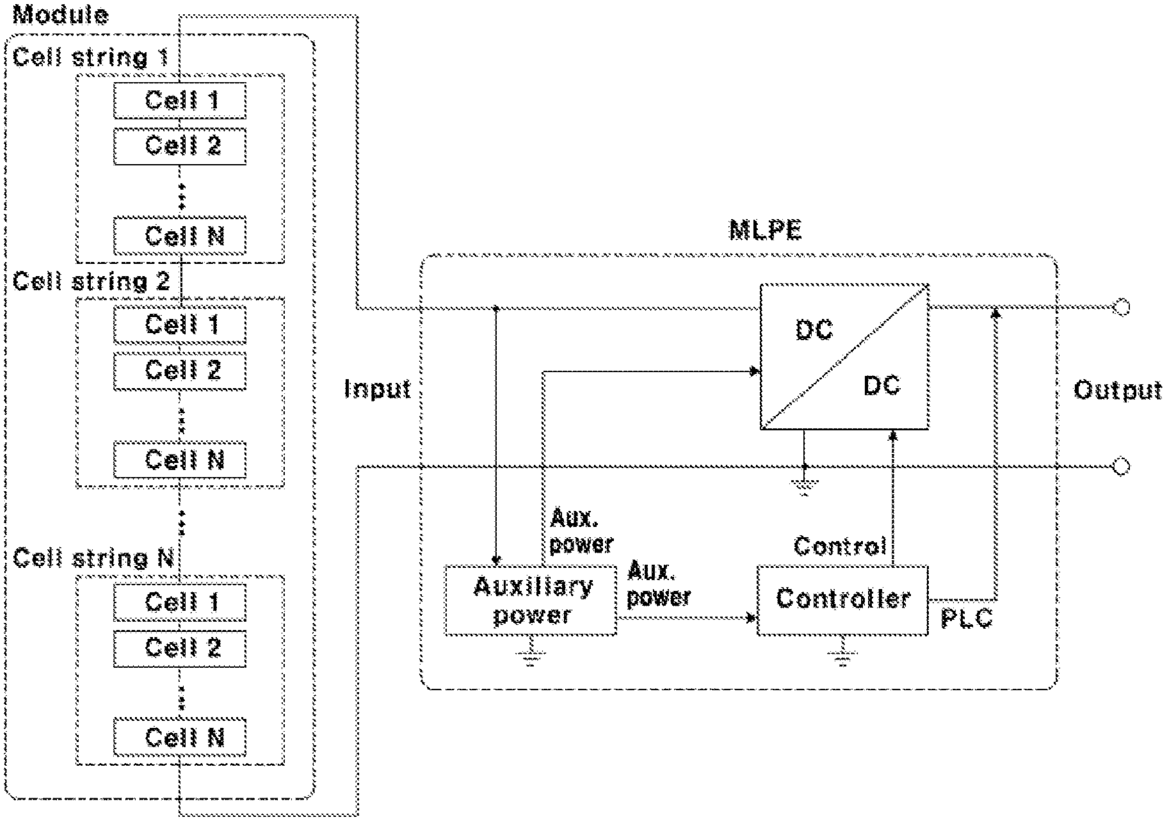

The auxiliary power supply unit 150 supplies driving power to each of the plurality of converters. Unlike FIGS. 3 and 4 in which the cell string, converter, controller, and auxiliary power source all use the same ground, in the multi-level configuration, the auxiliary power supply unit 150 must supply auxiliary power suitable for each level.

To this end, the auxiliary power supply unit 150 of the power conversion device according to a third embodiment includes an isolated converter. The primary circuit of the isolated converter receives the voltage of at least one output terminal among the output terminals of the plurality of cell strings, the isolated converter outputs a voltage to the secondary circuit according to the voltage of the primary circuit, and a plurality of secondary side circuits supplies driving power to each of the plurality of converters using the voltage being outputted from the isolated converter.

The voltage of at least one output terminal among the output terminals of the plurality of cell strings is applied to the primary side circuit, and at this time, in the primary side circuit, each of the output terminals of the plurality of cell strings may be connected in parallel through a switching element. Here, the switching element may be a diode as shown in FIG. 18. All output terminals of the plurality of cell strings are connected through diodes, so that the highest voltage among the cell string voltages can be selectively applied. That is, even if some cell strings lack sunlight, driving power for all converters can be provided by using voltages of other cell strings that sufficiently generate power. Through this, redundancy can also be secured. Or, it is natural that the voltage of a specific cell string may be received and used to supply auxiliary power without a diode.

The isolated converter may include at least one of a flyback converter, a forward converter, and an llc converter. The isolated converter can perform primary side regulation (psr). The psr may be performed with reference to the output voltage of the secondary circuit unit having the same reference potential as the primary circuit unit. The output of the secondary circuit unit can be controlled by referring to the voltage reflected to the primary side through the transformer. The isolated converter may use a tertiary winding to control the output of the secondary circuit unit. The isolated converter may be controlled by referring to only the output voltage of the secondary circuit unit with respect to the same potential as the primary circuit unit. For example, when the primary circuit unit is based on the ground, control may be performed with reference to the output voltage of the secondary circuit unit based on the ground.

An auxiliary power can be generated by combining a separate converter and a linear regulator that takes the output of the secondary circuit as an input.

The secondary side circuit, as shown in FIG. 19, may include: a first secondary circuit for supplying auxiliary power to the upper switch included in each of the converters;

and a second secondary circuit for supplying auxiliary power to the lower switch included in each of the converters. The converter may include a high-side fet and a low-side fet, and may supply auxiliary power to each of the high-side fet and the low-side fet.

It includes a control unit for monitoring at least one among the input signals and output signals of the plurality of converters and the current flowing through the inductors included in each converter and transmitting it to the outside through power line communication (plc), and generating and applying a control signal for each of the plurality of converters, wherein the secondary side circuit may include a third secondary side circuit that supplies driving power to the control unit. The secondary circuit unit may additionally use a secondary circuit unit for a separate purpose in addition to the secondary circuit unit corresponding to each converter. In addition, auxiliary power may be provided to various modules requiring power such as driving power.

After being driven by receiving auxiliary power, the plurality of converters 110 may receive a control signal from the control unit to perform maximum power point tracking control.

As shown in FIG. 17, a solar module according to a third embodiment of the present invention includes a plurality of cell strings 130, a plurality of converters 110, and an auxiliary power supply unit 150. The detailed description of the solar module of FIG. 17 corresponds to the detailed description of the power conversion device according to a third embodiment, so overlapping descriptions will be omitted.

Each of the plurality of cell strings 130 includes one or more solar cells, and the plurality of converters 110 are connected to each of the cell strings to form a multi-level structure. The auxiliary power supply unit 150 supplies driving power to each of the plurality of converters 110, wherein the auxiliary power supply unit 150 includes: a primary side circuit for receiving a voltage of at least one output terminal among the output terminals of the plurality of cell strings; an isolated converter for outputting a voltage to a secondary circuit according to the voltage of the circuit; and a plurality of secondary circuits for supplying driving power to each of the plurality of converters using the voltage being outputted from the isolated converter.

In the primary side circuit, output terminals of the plurality of cell strings may be connected in parallel through a diode. The secondary circuit includes a first secondary circuit for supplying auxiliary power to an upper switch included in each converter and a second secondary circuit for supplying auxiliary power to a lower switch included in each converter.

It may include a control unit for monitoring at least one of the input signal, the output signal, and the current flowing in the inductor included in each converter and transmitting it to the outside through power line communication (plc), or generating and applying a control signal for each of the plurality of converters, wherein the secondary side circuit may include a third secondary side circuit that supplies driving power to the control unit.

The power conversion device according to a fourth embodiment of the present invention includes a plurality of converters 110 and an auxiliary power supply unit 150, and may further include a voltage detection unit or a voltage detection unit. Among the detailed descriptions of the power conversion device according to a fourth embodiment of the present invention, descriptions corresponding to the detailed descriptions of the first to third embodiments will be omitted. The fourth embodiment of the present invention describes focused on the configuration of the auxiliary power supply unit that generates auxiliary power to drive the converter, and the like, so even if descriptions of some configurations are omitted, it is natural that configurations according to the embodiments of the present invention may be included.

A power conversion device according to a fourth embodiment of the present invention includes: a plurality of converters 110 each connected to a plurality of cell strings to configure a multi-level; and a plurality of auxiliary power supply units 150 for supplying driving power to each of the plurality of converters using the voltage being outputted from each cell string.

According to the configuration of the auxiliary power unit of the power conversion device according to the third embodiment, multiple auxiliary power sources can be generated with a single isolated converter, which is advantageous in terms of material cost reduction, but it is difficult to control the output voltage of the individual secondary circuit unit, and since there is a possibility that the entire auxiliary power circuit may malfunction due to a failure of a part of the auxiliary power circuit, the power conversion device according to a fourth embodiment individually generates and supplies auxiliary power being supplied to each converter.

In order to individually generate and supply auxiliary power, the auxiliary power supply unit 150 may include at least one of a single regulator and two or more regulators connected in a cascade.

Figures 20, 21:
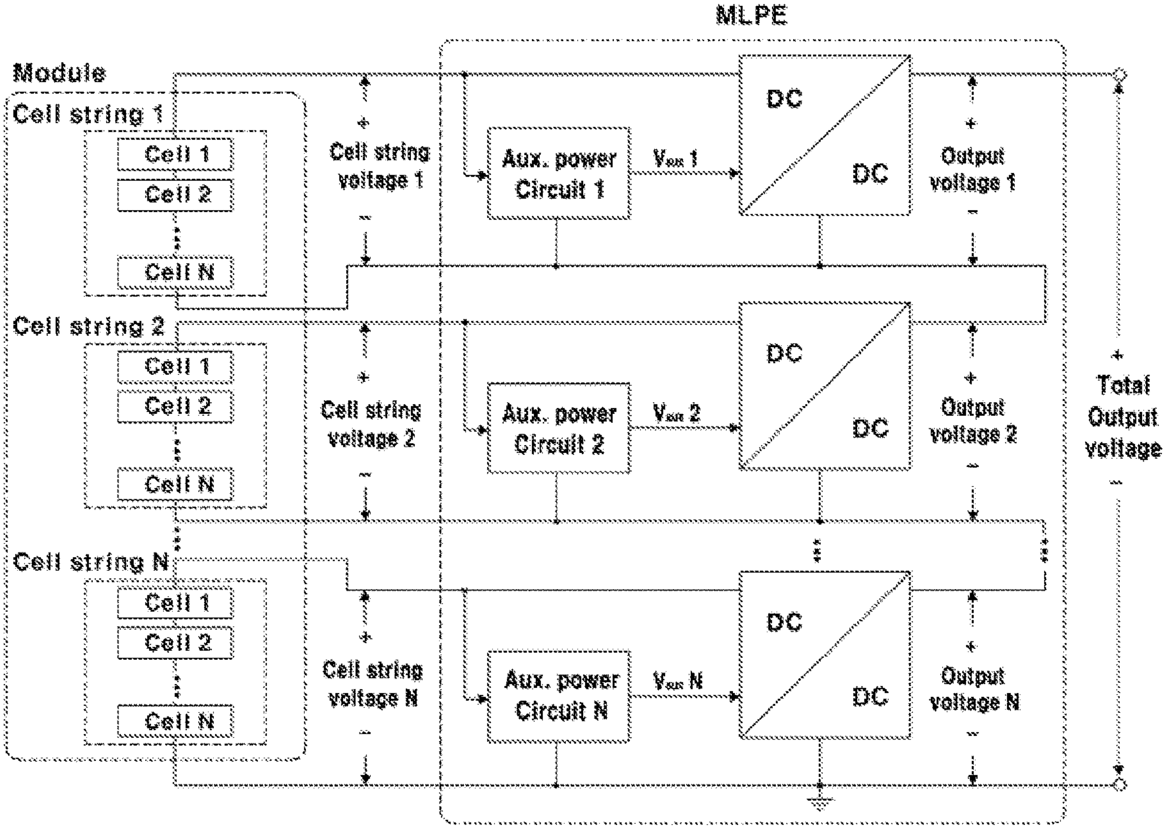
FIGS. 20 to 24 illustrate various embodiments of a power conversion device according to a fourth embodiment of the present invention.

Each auxiliary power supply unit 150 for supplying auxiliary power to each converter may include a single regulator. The single regulator may include at least one among a linear regulator, a charge pump, a step-up/down converter, and a step-up converter. The single regulator can optionally use a linear regulator, a charge pump, a step-up/down (buck-boost) converter, and a step-up (boost) converter. If the auxiliary power unit is implemented as a single regulator, as shown in FIG. 20, there is an advantage in that the circuit configuration is simple.

Since the cell string voltage frequently changes according to the condition of the solar cell, it must be appropriately applied according to the relationship between the range of variation of the string voltage and the target voltage vaux of the auxiliary power supply. As shown in FIG. 21, when the target voltage vaux of the auxiliary power is lower than the lowest cell string voltage, step-down is necessary, so in this case, a linear regulator or buck converter can be used. When the target voltage vaux of the auxiliary power is higher than the maximum cell string voltage, step-up is required, so in this case, a charge pump or boost converter can be used. When only step-up/down or step-up is required, the circuit configuration is relatively simple and can be implemented with low material cost.

However, when the target voltage vaux of the auxiliary power is lower than the highest cell string voltage and higher than the lowest cell string voltage, step-up and step-down are required, and in this case, a non-inverting buck-boost converter whose output voltage does not invert to a negative voltage must be used. The non-inverting buck-boost converter requires four semiconductor switches, which makes the circuit relatively complicated and the material cost becomes high.

Figure 22:
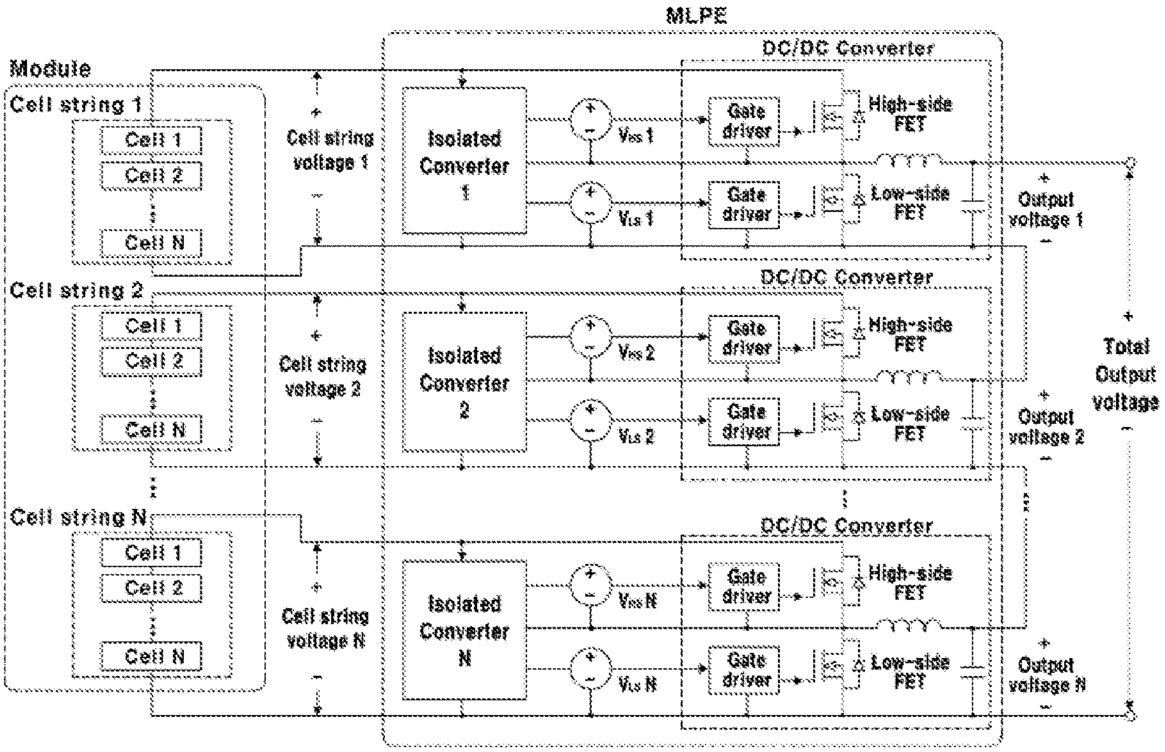

Auxiliary power supply unit 150 can be a multi-output isolated converter, and at this time, the multi-output isolated converter may include a first output for supplying auxiliary power to an upper switch included in each converter and a second output for supplying auxiliary power to a lower switch included in each of the converters. As shown in FIG. 22, as a single regulator, an isolated converter capable of multiple outputs may be applied. By using the isolated converter capable of multiple outputs, fet driving power can be supplied respectively to a low-side fet, which is a lower switch, and a high-side fet, which is an upper switch, included in the converter. In case of supplying a single auxiliary power to the converter, the high-side fet driving power must be supplied through a bootstrap circuit. Since the bootstrap circuit needs to charge the capacitor by intermittently conducting the low-side fet to maintain the output voltage, the high-side fet cannot be continuously conducting. In general, an operation of continuously conducting the high-side fet in order to bypass the cell string voltage to the output voltage frequently occurs during mlpe operation. When supplying driving power to the low-side fet and the high-side fet respectively using the isolated converter, the high-side fet can be operated without a bootstrap circuit. Through this, the disadvantages of the bootstrap circuit can be overcome and the high-side fet can be continuously conducted.

In configuring auxiliary power unit, two or more regulators connected in cascade can be used. The two or more stage regulator may include at least two among a linear regulator, a charge pump, a step-up/down converter, and a step-up converter. The two-stage of regulators of the same or different types may be used.

In implementing an auxiliary power circuit capable of step-up/down, a step-up regulator and a step-down regulator may be configured in a cascade. At this time, the circuit can be implemented regardless of the arrangement order of the step-up and step-down regulators. In the two-stage regulator configuration, the step-up and step-down type means that the auxiliary power supply voltage vaux is capable of step-up and step-down compared to the cell-string voltage.

Figures 23, 24:
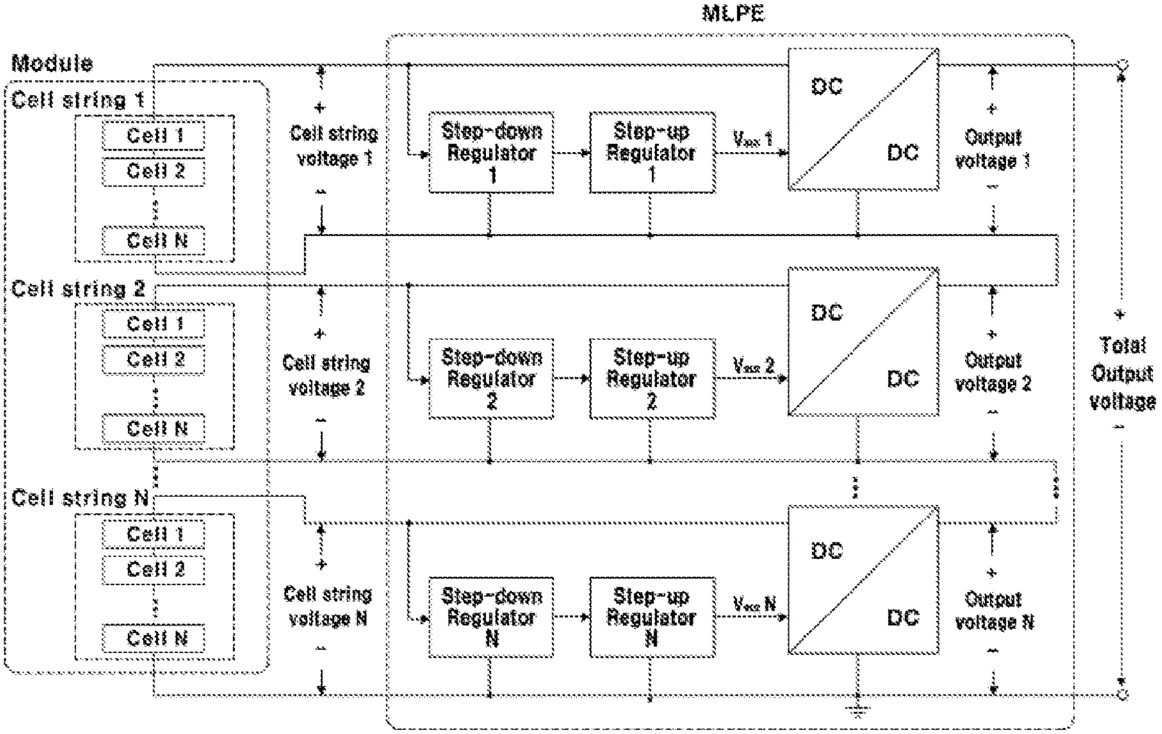

At this time, the two or more stage regulators may include a step-down regulator and a step-up regulator as shown in FIG. 23. Here, the step-down regulator may include at least one of a linear regulator and a step-down converter, and the step-up regulator may include at least one of a charge pump and a step-up converter.

As a two-stage regulator, it is possible to use a combination of a linear regulator, a differential pump, a step-up converter, a step-up/down converter, and a step-up converter, and in implementing a step-up/down function with a two-stage regulator, a step-down regulator and a step-up regulator may be combined. As shown in FIG. 24, an auxiliary power unit may be formed by a linear regulator-charge pump combination, a linear regulator-boost converter combination, a buck converter-charge pump combination, and a buck converter-boost converter combination. Combinations of 1 to 3 among these can reduce material costs compared to non-inverting buck-boost converters.

A power conversion device according to a fourth embodiment may include a control unit for monitoring at least one of the input signal, the output signal, and the current flowing in the inductor included in each converter and transmitting it to the outside through power line communication (plc), or generating and applying a control signal for each of the plurality of converters, wherein the plurality of converters may receive the control signal and perform maximum power point tracking control.

The solar module according to the fourth embodiment of the present invention is composed of a plurality of cell strings 130, a plurality of converters 110, and an auxiliary power supply unit 150. The detailed description of the solar module according to a fourth embodiment of the present invention corresponds to the detailed description of the power conversion device according to a fourth embodiment, so overlapping descriptions will be omitted.

Each of the plurality of cell strings 130 includes one or more solar cells, and the plurality of converters 110 are connected to each of the cell strings to form a multi-level structure. The auxiliary power supply unit 150 supplies driving power to each of the plurality of converters 110, and supplies driving power to each of the plurality of converters using the voltage being outputted from each cell string. The auxiliary power unit may include at least one of a single regulator and two or more regulators connected in a cascade.

Those skilled in the art related to the present embodiment will be able to understand that it may be implemented in a modified form within a range that does not deviate from the essential characteristics of the above description. Therefore, the disclosed methods are to be considered in an illustrative rather than a limiting sense. The scope of the present invention is shown in the claims rather than the foregoing description, and all differences within the equivalent scope shall be construed as being included in the present invention.

The invention claimed is:

1. A power conversion device comprising:
a plurality of converters each connected to a plurality of cell strings;
a voltage detection unit configured to detect at least one of an input voltage and an output voltage of each of the plurality of converters; and
a control unit configured to generate and apply a control signal for each of the plurality of converters by using the voltage detected by the voltage detection unit,
wherein the plurality of converters constitutes a multi-level, and
wherein the control signal comprises a PWM signal for a switching element included in the converter.

2. The power conversion device according to claim 1, wherein the voltage detection unit comprises two resistors connected in series between an input terminal or an output terminal of each converter and a ground, and detects a voltage applied to a node between the two resistors.

3. The power conversion device according to claim 1, wherein the control unit calculates a voltage measured in each converter using a difference in voltages detected from neighboring converters of a lower level.

4. The power conversion device according to claim 1, wherein the control unit calculates a voltage measured in a converter of the lowest level as a voltage of the converter of the lowest level.

5. The power conversion device according to claim 1, wherein the control unit calculates a voltage measured at an output terminal of the highest level converter as a total output voltage.

6. The power conversion device according to claim 1, wherein the voltage detection unit comprises:
two resistors connected in series between input terminals or output terminals of each of the converters; and
a reference potential converter configured to convert a reference electric potential of a voltage applied to a node between the two resistors into a reference electric potential equal to that of the control unit.

7. The power conversion device according to claim 1, wherein the plurality of converters receives the control signal and performs maximum power point tracking control.

8. The power conversion device according to claim 1, wherein the plurality of converters is connected in cascode.

9. The power conversion device according to claim 1, wherein the control unit monitors at least one of input signals, output signals of the plurality of converters, and current flowing in inductors included in each converter, and transmits the monitored information to outside through power line communication (PLC).

10. The power conversion device according to claim 1, wherein the control unit individually generates a control signal for each of the plurality of converters corresponding to each cell string according to an output signal of each of the plurality of cell strings.

11. The power conversion device according to claim 1, wherein control signals for the plurality of converters is applied in synchronization or applied with a predetermined phase difference.

12. A solar module comprising:
a plurality of cell strings each comprising one or more solar cells;
a plurality of converters being respectively connected to each of the cell strings;
a voltage detection unit configured to detect at least one of an input voltage and an output voltage of each of the plurality of converters; and
a control unit configured to generate and apply a control signal for each of the plurality of converters by using the voltage detected by the voltage detection unit,
wherein the plurality of converters constitutes a multilevel, and
wherein the control signal comprises a PWM signal for a switching element included in the converter.

13. The solar module according to claim 12, wherein the voltage detection unit comprises two resistors connected in series between an input terminal or an output terminal of each converter and a ground, and detects a voltage applied to a node between the two resistors.

14. The solar module according to claim 12, wherein the control unit calculates a voltage measured in each converter using a difference in voltages detected from neighboring converters of a lower level.

15. The solar module according to claim 12, wherein the control unit calculates a voltage measured in a converter of the lowest level as a voltage of the converter of the lowest level.

16. The solar module according to claim 12, wherein the control unit calculates a voltage measured at an output terminal of the highest level converter as a total output voltage.

17. The solar module according to claim 12, wherein the voltage detection unit comprises:
two resistors connected in series between input terminals or output terminals of each of the converters; and
a reference potential converter configured to convert a reference electric potential of a voltage applied to a node between the two resistors into a reference electric potential equal to that of the control unit.

18. The solar module according to claim 12, wherein the plurality of converters receives the control signal and performs maximum power point tracking control.

19. The solar module according to claim 12, wherein the plurality of converters is connected in cascode.

* * * * *